US011860695B2

(12) United States Patent
Cho et al.

(10) Patent No.: US 11,860,695 B2
(45) Date of Patent: Jan. 2, 2024

(54) ELECTRONIC DEVICE

(71) Applicant: Samsung Display Co., Ltd., Yongin-si (KR)

(72) Inventors: Sungyeon Cho, Hwaseong-si (KR); Jin Yong Sim, Seongnam-si (KR); Taekwang Kim, Asan-si (KR); Kukbin Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/894,031

(22) Filed: Aug. 23, 2022

(65) Prior Publication Data

US 2023/0061333 A1 Mar. 2, 2023

(30) Foreign Application Priority Data

Sep. 1, 2021 (KR) .................. 10-2021-0116039

(51) Int. Cl.
*G06F 1/16* (2006.01)
*H05K 1/18* (2006.01)

(52) U.S. Cl.
CPC .......... *G06F 1/1652* (2013.01); *G06F 1/1643* (2013.01); *H05K 1/189* (2013.01); *H05K 2201/10128* (2013.01)

(58) Field of Classification Search
CPC combination set(s) only.
See application file for complete search history.

(56) References Cited

U.S. PATENT DOCUMENTS

| | | | |
|---|---|---|---|
| 10,236,471 B2 | 3/2019 | Oh et al. | |
| 11,044,820 B2 | 6/2021 | Yu et al. | |
| 11,184,980 B2 | 11/2021 | An et al. | |
| 11,353,922 B2 * | 6/2022 | Lee | G06F 1/1652 |
| 11,653,520 B2 * | 5/2023 | Sim | H04M 1/022 |
| | | | 361/679.01 |
| 11,681,330 B2 * | 6/2023 | Sim | G06F 1/1637 |
| | | | 345/173 |

(Continued)

FOREIGN PATENT DOCUMENTS

| | | |
|---|---|---|
| KR | 10-2016-0080860 A | 7/2016 |
| KR | 10-2017-0106589 A | 9/2017 |

(Continued)

*Primary Examiner* — Lisa Lea-Edmonds
(74) *Attorney, Agent, or Firm* — Lewis Roca Rothgerber Christie LLP

(57) ABSTRACT

An electronic device includes: a display panel including a first region having a pixel therein, a bending region bent with respect to a virtual axis, and a second region with the bending region between the first region and the second region, wherein the first region and the second region are configured to face each other in a bent configuration; a lower plate below the display panel; a flexible circuit board connected to the second region, and including insulating layers with an opening portion in at least part thereof, a ground signal line, and a ground pattern exposed from the insulating layers by the opening portion and connected to the ground signal line; a resin layer on a first surface of the flexible circuit board, and covering the opening portion, the resin layer having a flat surface; and an adhesive layer bonding the resin layer to the lower plate.

20 Claims, 15 Drawing Sheets

(56) References Cited

U.S. PATENT DOCUMENTS

| | | | | |
|---|---|---|---|---|
| 11,686,883 B2* | 6/2023 | Kim | .................... | G06F 1/181 |
| | | | | 361/679.02 |
| 11,711,901 B2* | 7/2023 | Lee | .................... | G06F 3/044 |
| | | | | 345/174 |
| 2021/0247806 A1* | 8/2021 | Lee | .................... | H05K 5/0226 |
| 2022/0043481 A1* | 2/2022 | Shin | .................... | G06F 3/0412 |
| 2022/0386487 A1* | 12/2022 | Lee | .................... | H04M 1/0216 |
| 2023/0061333 A1* | 3/2023 | Cho | .................... | H05K 1/189 |
| 2023/0199097 A1* | 6/2023 | Jung | .................... | G06F 1/1652 |
| | | | | 361/679.01 |
| 2023/0230511 A1* | 7/2023 | Park | .................... | G06F 1/1652 |
| | | | | 361/679.01 |
| 2023/0244350 A1* | 8/2023 | Jeong | .................... | G06F 3/0446 |
| | | | | 345/174 |

FOREIGN PATENT DOCUMENTS

| | | | |
|---|---|---|---|
| KR | 10-2019-0049399 A | 5/2019 | |
| KR | 10-2020-0101116 A | 8/2020 | |

\* cited by examiner

ELECTRONIC DEVICE

CROSS-REFERENCE TO RELATED APPLICATIONS

The present application claims priority to and the benefit of Korean Patent Application No. 10-2021-0116039, filed on Sep. 1, 2021, the entire content of which are hereby incorporated by reference.

BACKGROUND

1. Field

Aspects of some embodiments of the present disclosure herein relate to an electronic device.

2. Description of the Related Art

An electronic device may include a display region activated in response to electrical signals. The electronic device may detect an input externally applied, for example, at the display region, and may also display various images, thereby providing a user with information. Recently, as display devices with various shapes are developed, display regions with various shapes may be achieved.

The above information disclosed in this Background section is only for enhancement of understanding of the background and therefore the information discussed in this Background section does not necessarily constitute prior art.

SUMMARY

Aspects of some embodiments of the present disclosure herein relate to an electronic device, and for example, to a foldable electronic device.

Aspects of some embodiments of the present disclosure include an electronic device with relatively reduced occurrences of a defects in which a stepped portion of a flexible circuit board is visible.

According to some embodiments of the inventive concept, an electronic device includes: a display panel having a first region with a pixel therein, a bending region bent with respect to a virtual axis, and a second region arranged to face the first region with the bending region therebetween, a lower plate below the display panel; a flexible circuit board connected to the second region, and having insulating layers with an opening portion defined in at least part thereof, a ground signal line, and a ground pattern exposed from the insulating layers by the opening portion and connected to the ground signal line; a resin layer on a first surface of the flexible circuit board, and configured to cover the opening portion and to provide a flat surface; and an adhesive layer configured to bond the flat surface of the resin layer and the lower plate.

According to some embodiments, the resin layer and the adhesive layer may include a conductive material.

According to some embodiments, the resin layer may be only in the opening portion, and the first surface of the flexible circuit board may define the same plane as the flat surface of the resin layer.

According to some embodiments, the opening portion may include a first opening portion and a second opening portion spaced apart from each other, and the ground pattern may include a first pattern exposed from the insulating layers by the first opening portion, and a second pattern exposed from the insulating layers by the second opening portion and connected to the first pattern by the ground signal line. The first pattern and the second pattern may be in contact with the resin layer.

According to some embodiments, the flexible circuit board may further include a protrusion portion between the first opening portion and the second opening portion, and protruding from the first surface toward the resin layer. The protrusion portion may be covered by the resin layer.

According to some embodiments, the insulating layers may include first to third insulating layers. The first opening portion may be defined by penetrating the second insulating layer and the third insulating layer, and the first ground pattern may be on the first insulating layer and exposed from the second insulating layer and the third insulating layer by the first opening portion. The second opening portion may be defined by penetrating the third insulating layer, and the second ground pattern may be on the second insulating layer and exposed from the third insulating layer by the second opening portion.

According to some embodiments, the flexible circuit board may include a covered region including the opening portion, and an uncovered region separated from the opening portion, and the resin layer may be only in the covered region and separated from the uncovered region.

According to some embodiments, the adhesive layer may include a first portion overlapping the uncovered region, and a second portion overlapping the covered region. The second portion may be in contact with the flat surface, and the first portion may be in contact with the first surface of the flexible circuit board.

According to some embodiments, the first region may include a first non-folding region, a folding region and a second non-folding region which are arranged in a direction crossing a direction in which the virtual axis extends, and the electronic device further include an upper plate between the display panel and the lower plate. The upper plate may include opening portions overlapping the folding region.

According to some embodiments, the electronic device may further include a digitizer between the upper plate and the lower plate.

According to some embodiments, the digitizer may include a first digitizer overlapping the first non-folding region, and a second digitizer overlapping the second non-folding region. The first digitizer and the second digitizer may be separated by a predetermined gap in the folding region.

According to some embodiments, the electronic device may further include a first metal layer between the digitizer and the lower plate and overlapping the first digitizer, and a second metal layer overlapping the second digitizer.

According to some embodiments, the lower plate may include any one of a stainless steel or a fiber-reinforced composite material.

According to some embodiments of the inventive concept, an electronic device includes: a display panel having a first region with a pixel therein, a bending region bent with respect to a virtual axis, and a second region arranged to face the first region with the bending region therebetween; a lower plate below the display panel; a flexible circuit board connected to the second region, including a first surface facing the lower plate and a second surface opposite to the first surface, and having a ground pattern in which a stepped region is defined by removal of a portion of the first surface and which is exposed from the stepped region, and a ground signal line connected to the ground pattern; a resin layer on the first surface of the flexible circuit board, configured to cover the stepped region, and including a conductive material; and an adhesive layer between the resin layer and the lower plate and including a conductive material.

According to some embodiments, an adhesive layer-contacting surface of the resin layer may be a flat surface.

According to some embodiments, the resin layer may be only in the stepped region, and the first surface of the flexible circuit board may define the same plane as the adhesive layer-contacting surface of the resin layer.

According to some embodiments, the stepped region may be provided in plurality, and the plurality of stepped regions are spaced apart from each other, and the ground pattern may include a plurality of ground patterns which are connected to each other through the ground signal line, and each of which is exposed in a corresponding stepped region of the stepped regions. The ground patterns may be in contact with the resin layer.

According to some embodiments, the electronic device may further include a protrusion portion between the stepped regions and protruding from the first surface of the flexible circuit board toward the resin layer. The protrusion portion may be covered by the resin layer.

According to some embodiments, the electronic device may further include an upper plate between the display panel and the lower plate, and a digitizer between the upper plate and the lower plate.

According to some embodiments, the lower plate may include any one of a stainless steel or a fiber-reinforced composite material.

BRIEF DESCRIPTION OF THE DRAWINGS

The accompanying drawings are included to provide a further understanding of the inventive concept, and are incorporated in and constitute a part of this specification. The drawings illustrate aspects of some embodiments of the inventive concept and, together with the description, serve to explain aspects of some embodiments of the inventive concept. In the drawings.

DETAILED DESCRIPTION

Figure 1A:
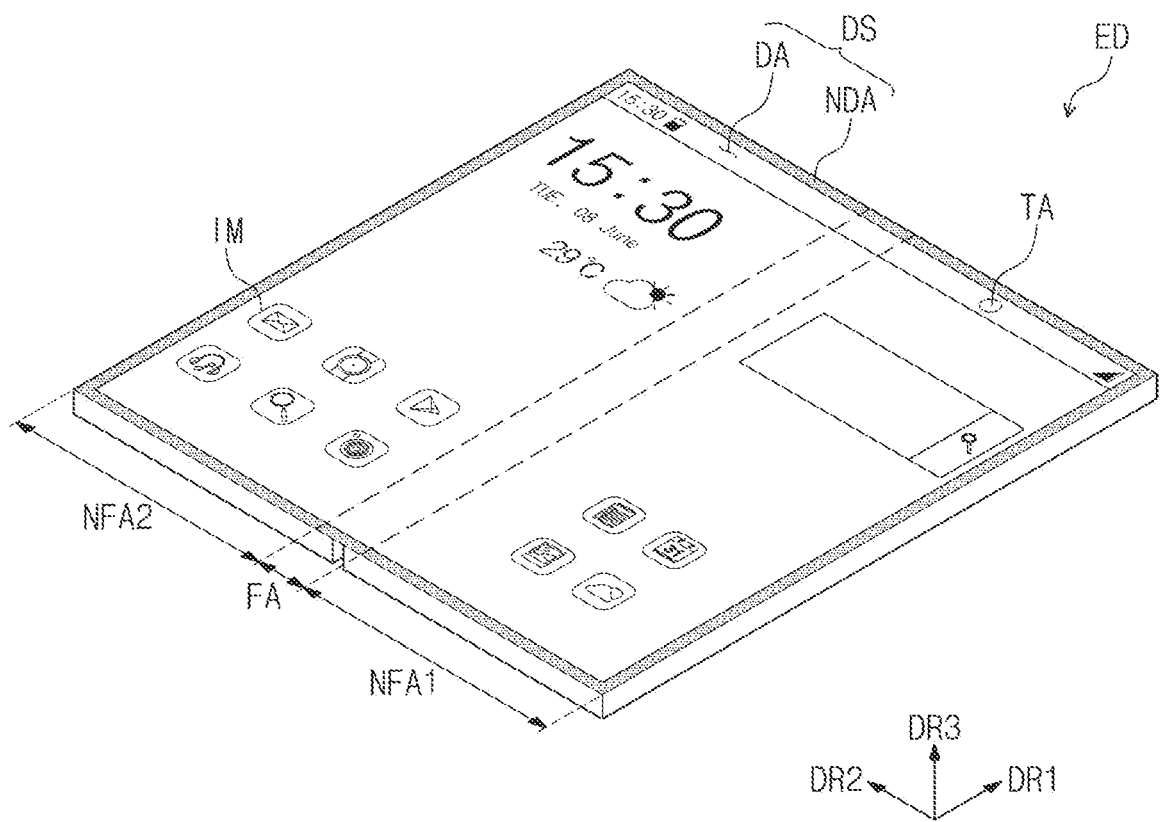
FIGS. 1A to 1C are perspective views of an electronic device according to some embodiments of the inventive concept.

It will be understood that when an element (or region, layer, section, etc.) is referred to as being "on", "connected to" or "coupled to" another element, it can be located or arranged directly on, connected or coupled to the other element or a third intervening elements may be located between the elements.

Like reference numbers or symbols refer to like elements throughout. In addition, in the drawings, the thickness, the ratio, and the dimension of elements are exaggerated for effective description of the technical contents. The term "and/or" includes one or more combinations which may be defined by relevant elements.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the inventive concept will be explained in more detail with reference to the accompanying drawings.

Figure 1B:
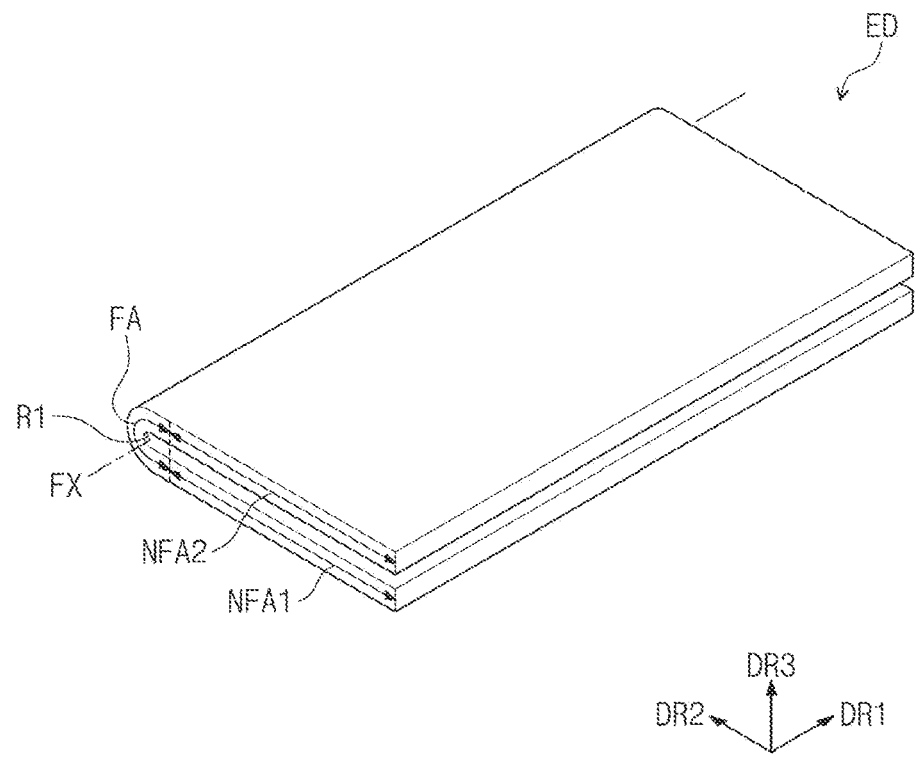
Figure 1C:
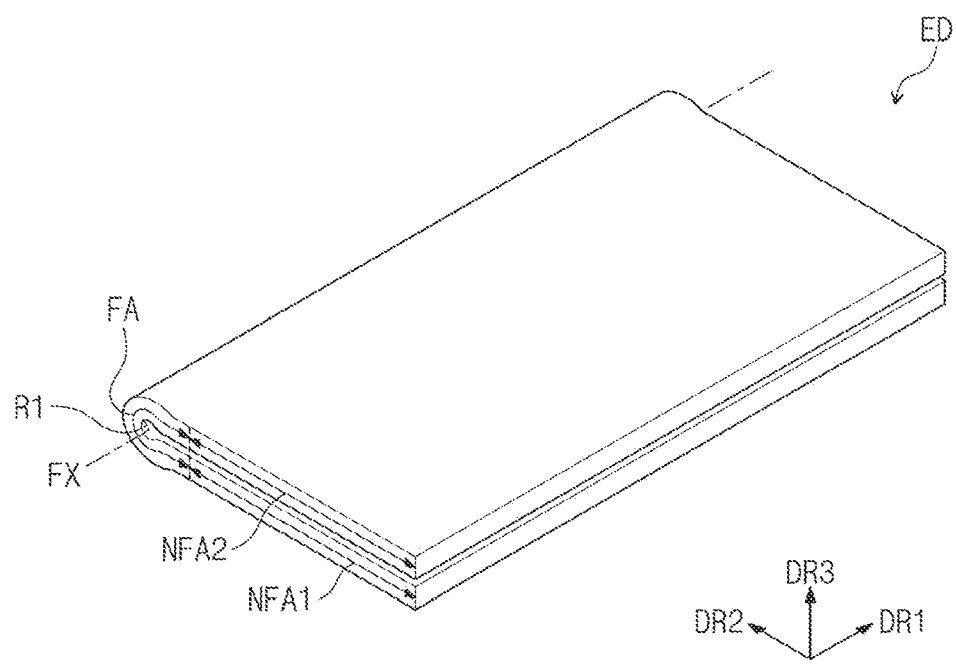

FIGS. 1A to 1C are perspective views of an electronic device according to some embodiments of the inventive concept. FIG. 1A illustrates an unfolded state according to some embodiments, and FIGS. 1B and 1C illustrate a folded state according to some embodiments.

Referring to FIGS. 1A to 1C, an electronic device ED may be a device activated in response to electrical signals. The electronic device ED may include various embodiments. For example, the electronic device ED may include a tablet computer, a laptop computer, a desktop computer, a smart television, etc. For the purpose of illustration, the electronic device ED is illustrated as a smartphone, but embodiments according to the present disclosure are not limited thereto.

The electronic device ED according to some embodiments of the inventive concept may include a display surface DS defined by a first direction DR1 and a second direction DR2 crossing the first direction DR1. The electronic device ED may display images IM to be viewed by a user through the display surface DS.

The display surface DS may include a display region DA and a non-display region NDA around the display region DA. The display region DA may display the images IM, and the non-display region NDA may not display the images IM. The non-display region NDA may surround the display region DA. That is, the non-display region NDA may be in a periphery (or outside a footprint) of the display region DA. However, embodiments of the inventive concept are not limited thereto, and the shape of the display region DA and the shape of the non-display region NDA may be modified and at least a part of the non-display region NDA may be omitted.

The display surface DS may include a sensing region TA. The sensing region TA may be a portion of the display region DA. The sensing region TA has a higher light transmittance than the other region of the display region DA. Hereinafter, the other region of the display region DA except for the sensing region TA may be defined as a general display region.

A light signal, for example, visible light or infrared light, may travel to the sensing region TA. The electronic device ED may capture an external image using visible light passing through the sensing region TA, or may determine approach of an external object using infrared light. FIG. 1A illustrates one sensing region TA for the purpose of illustration, but embodiments of the inventive concept are not limited thereto and some embodiments may include a plurality of sensing regions TA.

Hereinafter, a third direction DR3 is defined as a direction substantially perpendicularly crossing (or normal with respect to) a plane defined by the first direction DR1 and the second direction DR2. The third direction DR3 serves as a basis for distinguishing front and rear surfaces of each member. In the present disclosure, the term "on a plane" or "in a plan view" may be defined as a state as seen from the third direction DR3 (i.e., looking toward the display surface DS).

The electronic device ED may include a folding region FA and a plurality of non-folding regions NFA1 and NFA2. The non-folding regions NFA1 and NFA2 may include a first non-folding region NFA1 and a second non-folding region NFA2. In the second direction DR2, the folding region FA may be located between the first non-folding region NFA1 and the second non-folding region NFA2.

As illustrated in FIG. 1B, the folding region FA may be folded with respect to a folding axis FX parallel to the first direction DR1. The folding region FA may be in-folded such that the first non-folding region NFA1 and the second non-folding region NFA2 face each other and the display surface DS of the electronic device ED is not exposed to the outside. Here, the folding region FA may be folded with a radius (e.g., a set or predetermined radius of curvature) R1.

According to some embodiments of the inventive concept, the electronic device ED may be out-folded such that the display surface DS is exposed to the outside. The electronic device ED may be configured to repeat an operation from an unfolding operation to an in-folding or out-folding operation, or vice versa, but embodiments of the inventive concept are not limited thereto. According to some embodiments of the inventive concept, the electronic device ED may be configured to select any one of an unfolding operation, an in-folding or an out-folding operation.

As illustrated in FIG. 1B, according to some embodiments, a distance between the first non-folding region NFA1 and the second non-folding region NFA2 may be greater than radius of curvature R1. As illustrated in FIG. 1C, according to some embodiments, a distance between the first non-folding region NFA1 and the second non-folding region NFA2 may be smaller than radius of curvature R1. Those illustrated in FIGS. 1B and 1C are based on the display surface DS, and a housing HM (see FIG. 2A) constituting the exterior of the electronic device ED may make contact with the end sections of the first non-folding.

Figure 2A:
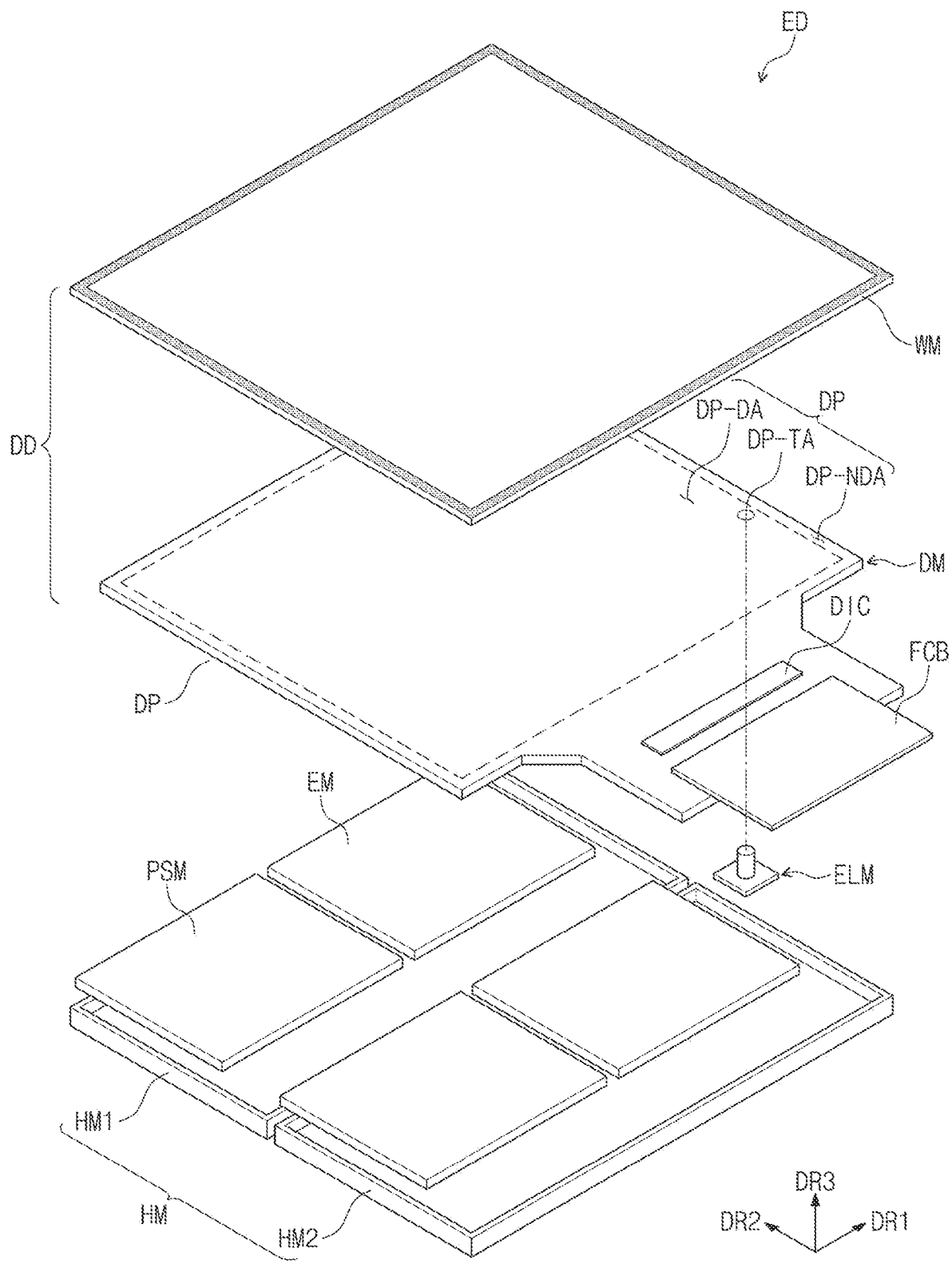
FIG. 2A is an exploded perspective view of an electronic device according to some embodiments of the inventive concept.
Figure 2B:
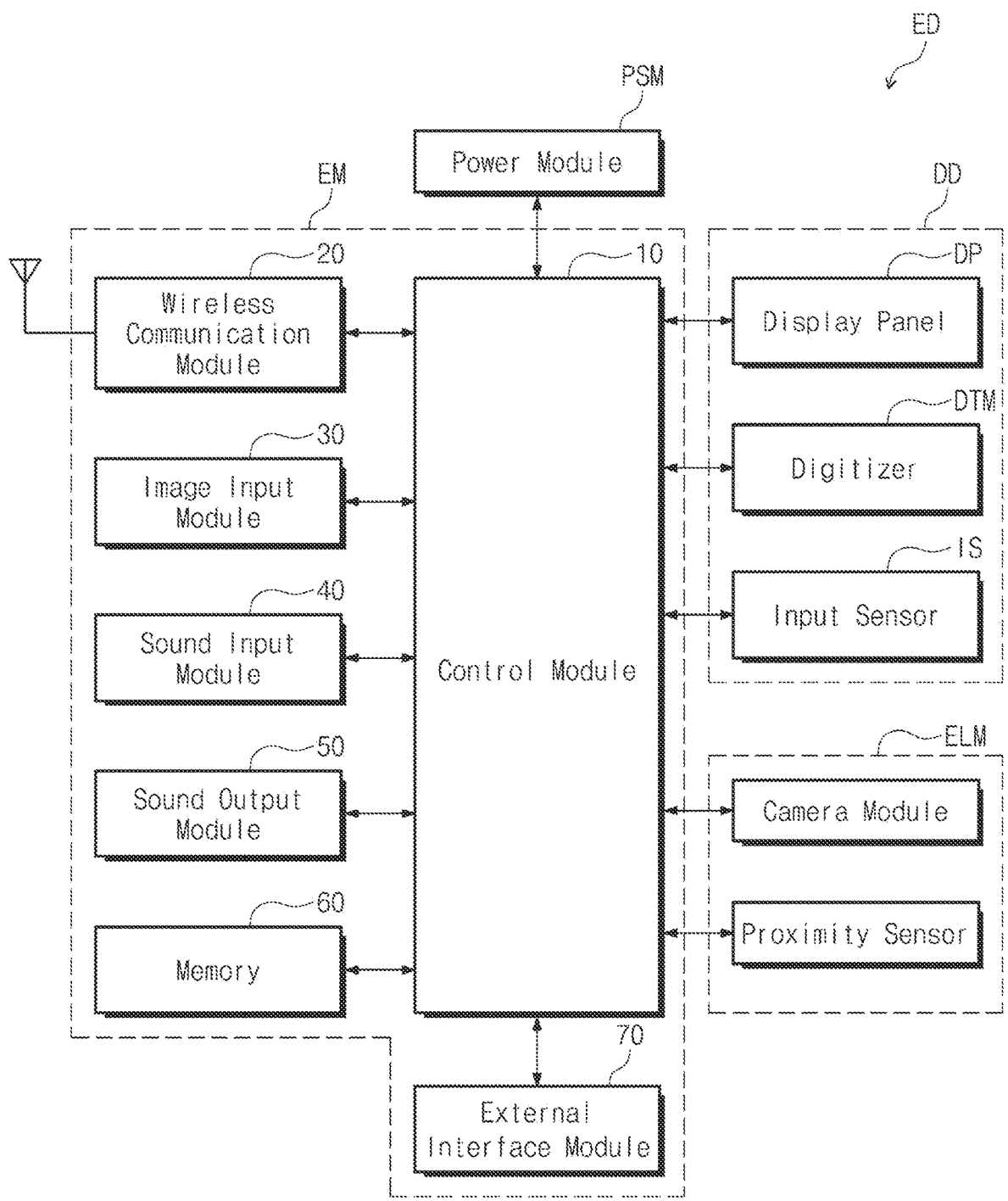
FIG. 2B is a block diagram of an electronic device according to some embodiments of the inventive concept.

FIG. 2A is an exploded perspective view of an electronic device according to some embodiments of the inventive concept. FIG. 2B is a block diagram of an electronic device according to some embodiments of the inventive concept.

As illustrated in FIGS. 2A and 2B, an electronic device ED may include a display device DD, an electronic module EM, an electro-optic module ELM, a power module PSM and a housing HM. Although not separately illustrated, the electronic device ED may further include a mechanism structure for controlling a folding operation of the display device DD.

The display device DD generates images and detects an external input. The display device DD includes a window WM and a display module DM. The window WM provides a front surface of the electronic device ED. The window WM will be described later in more detail.

The display module DM may at least include a display panel DP. FIG. 2A illustrates only the display panel DP in a stacked structure of the display module DM. According to some embodiments, however, the display module DM may further include a plurality of components located above the display panel DP. The stacked structure of the display module DM will be described later in more detail.

The display panel DP may generate images. The display panel DP is not particularly limited, and may be, for example, a light emitting display panel, such as an organic light emitting display panel or a quantum-dot light emitting display panel.

The display panel DP includes a display region DP-DA and a non-display region DP-NDA which respectively correspond to the display region DA (see FIG. 1A) and the non-display region NDA (see FIG. 1A) of the electronic device ED. In the present disclosure, "a region/part corresponds to another region/part" means overlapping, and is not limited to having the same area.

The display panel DP may include a sensing region DP-TA corresponding to the sensing region TA in FIG. 1A. The sensing region TA may have a relatively lower resolution than the display region DP-DA. For example, pixels in the sensing region TA may have a relatively lower density than the display region DP-DA.

As illustrated in FIG. 2A, a driving chip DIC may be located on the non-display region DP-NDA of the display panel DP. A flexible circuit board FCB may be connected to the non-display region DP-NDA of the display panel DP. The flexible circuit board FCB may be connected to a main circuit board. The main circuit board may be an electronic component constituting the electronic module EM.

The driving chip DIC may include driving elements, for example, a data driving circuit, for driving pixels of the display panel DP. FIG. 2A illustrates a structure in which the driving chip DIC is mounted on the display panel DP, but embodiments of the inventive concept are not limited thereto. For example, the driving chip DIC may be mounted on the flexible circuit board FCB.

As illustrated in FIG. 2B, the display device DD may further include an input sensor IS and a digitizer DTM. The input sensor IS detects a user's input. A capacitive-type input sensor IS may be located above the display panel DP. The digitizer DTM detects an input of a stylus pen. An electromagnetic induction-type digitizer may be located below the display panel DP.

The electronic module EM may include a control module 10, a wireless communication module 20, an image input module 30, a sound input module 40, a sound output module 50, a memory 60 and an external interface module 70.

The electronic module EM may include a main circuit board, and the above-described modules may be mounted on the main circuit board or may be electrically connected to the main circuit board through the flexible circuit board FCB. The electronic module EM is electrically connected to the power module PSM.

Referring to FIG. 2B, the electronic modules EM may be located in a first housing HM1 and a second housing HM2, respectively, and the power modules PSM may be located in the first housing HM1 and the second housing HM2, respectively. According to some embodiments, the electronic module EM located in the first housing HM1, and the electronic module EM located in the second housing HM2, are electrically connected to each other through the flexible circuit board FCB.

The control module 10 controls an overall operation of the electronic device ED. For example, the control module 10 activates or inactivates the display device DD in accordance with the use's input. The control module 10 may control the image input module 30, the sound input module 40, the sound output module 50, etc., in accordance with the user's input. The control module 10 may include at least one microprocessor.

The wireless communication module 20 may transmit/receive a wireless signal to/from another terminal using a Bluetooth or WiFi channel. The wireless communication module 20 may transmit/receive an audio signal using a general communication channel. The wireless communication module 20 may include a plurality of antenna modules.

The image input module 30 processes an image signal to convert the image signal to image data displayable on the display device DD. The sound input module 40 receives an external sound signal through a microphone in a recording mode, an audio recognition mode, etc., and converts the external audio signal to an electronic audio data. The sound output module 50 converts sound data received from the wireless communication module 20, or sound data stored in the memory 60, and outputs the converted sound data.

The external interface module 70 serves as an interface connected to an external charger, a wired/wireless data port, a card socket (e.g., a memory card and a SIM/UIM card), etc.

The power module (or power supply module) PSM supplies power required for the overall operation of the electronic device ED. The power module PSM may include a typical battery device.

The electro-optic module ELM may be an electronic component for outputting or receiving an optical signal. The electro-optic module ELM may include a camera module and/or a proximity sensor. The camera module captures images of external objects through the sensing region DP-TA.

Figure 3:
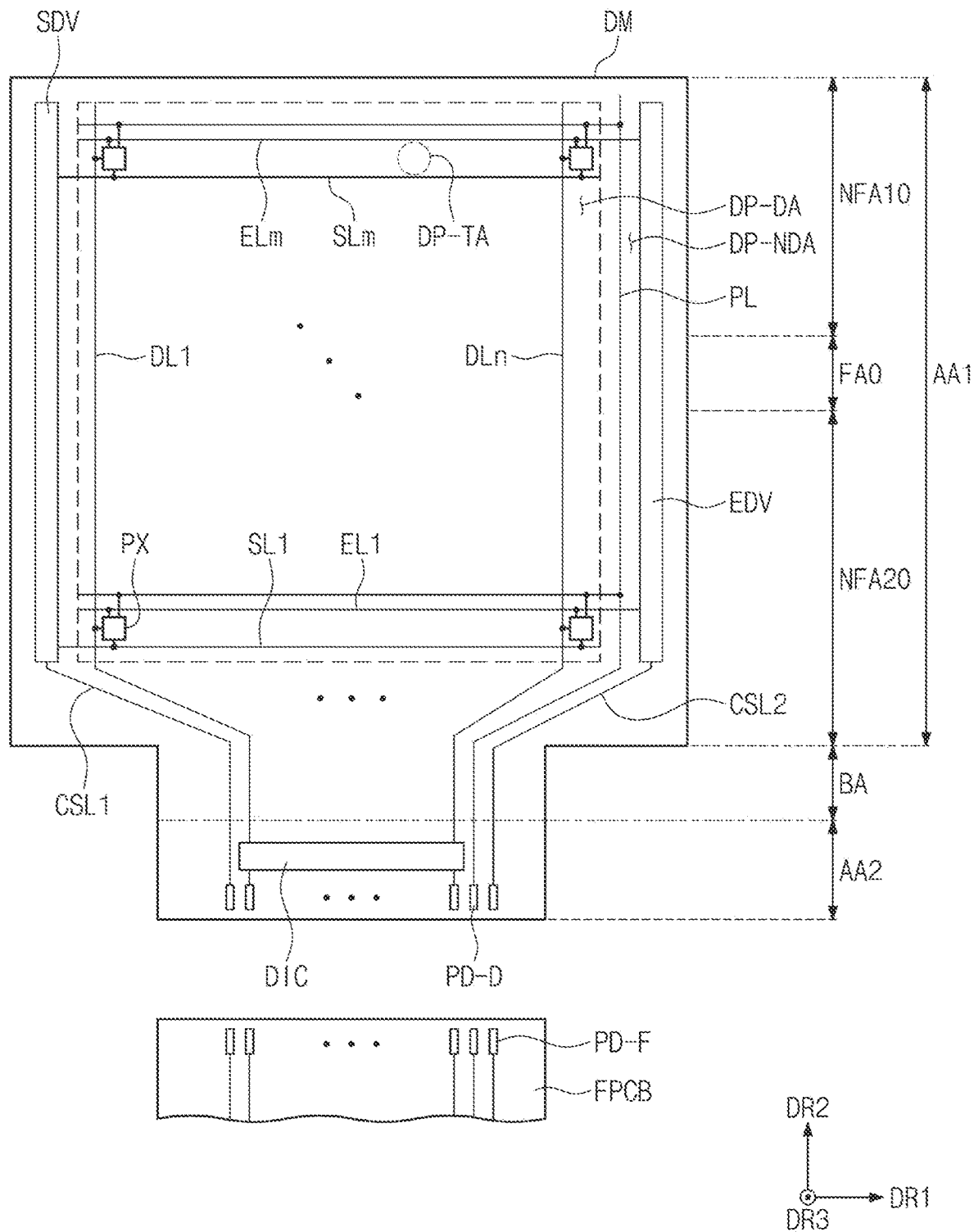
FIG. 3 is a plan view of a display panel according to some embodiments of the inventive concept.

FIG. 3 is a plan view of a display panel according to some embodiments of the inventive concept.

Referring to FIG. 3, a display panel DP may include a display region DP-DA and a non-display region DP-NDA around the display region DP-DA. The display region DP-DA and the non-display region DP-NDA are distinguished from each other according to whether a pixel PX is present or not. The pixel PX is located in the display region DP-DA. A scan driving unit SDV, a data driving unit and an emission driving unit EDV may be arranged in the non-display region DP-NDA. The data driving unit may be a partial circuit included in a driving chip DIC illustrated in FIG. 3.

The display panel DP includes a first region AA1, a second region AA2 and a bending region BA, which are defined in the second direction DR2. The second region AA2 and the bending region BA may be a partial region of the non-display region DP-NDA. The bending region BA is located between the first region AA1 and the second region.

As the bending region BA is bent, a rear surface of the display panel DP in the first region AA1 and a rear surface of the display panel DP in the second region AA2, may face each other.

The first region AA1 is a region corresponding to the display surface DS in FIG. 1A. The first region AA1 may include a first non-folding region NFA10, a second non-folding region NFA20 and a folding region FA0. The first non-folding region NFA10, the second non-folding region NFA20 and the folding region FA0 respectively correspond to the first non-folding region NFA1, the second non-folding region NFA2 and the folding region FA in FIGS. 1A to 1C.

In the first direction DR1, the lengths of the bending region BA and the second region AA2 may be smaller than the length of the first region AA1. Accordingly, the bending region BA may be relatively easily bent.

The display panel DP may include a plurality of pixels PX, a plurality of scan lines SL1 to SLm, a plurality of data lines DL1 to DLn, a plurality of light emitting lines EL1 to ELm, first and second control lines CSL1 and CSL2, a power line PL, and a plurality of display pads PD-D. Here, m and n are natural numbers. The pixels PX may be connected to the scan lines SL1 to SLm, the data lines DL1 to DLn, and the light emitting lines EL1 to Elm.

The scan lines SL1 to SLm may extend in the second direction DR2 to be connected to the scan driving unit SDV. The data lines DL1 to DLn may extend in the second direction DR2 and be connected to the driving chip DIC via the bending region BA. The light emitting lines EU to Elm may extend in the first direction DR1 to be connected to the emission driving unit EDV.

The power line PL may include a portion extending in the second direction DR2 and a portion extending in the first direction DR1. The portion extending in the first direction DR1, and the portion extending in the second direction DR2, may be located on layers different from each other. In the power line PL, the portion extending in the second direction DR2 may extend to the second region AA2 via the bending region BA. The power line PL may supply a first voltage to the pixels PX.

A first control line CSL1 may be connected to the scan driving unit SDV and extend toward a lower end of the second region AA2 via the bending region BA. A second control line CSL2 may be connected to the emission driving unit EDV and extend toward the lower end of the second region AA2 via the bending region BA.

On a plane, the display pads PD-D may be located adjacent to the lower end of the second region AA2. The driving chip DIC, the power line PL, the first control line CSL1 and the second control line CSL2 may be connected to the display pads PD-D. Each of substrate pads PD-F of the flexible circuit board FCB may be connected, through an anisotropic conductive adhesive layer, to a corresponding display pad PD-D among the display pads PD-D.

A sensing region DP-TA may have a higher light transmittance and a lower resolution than the display region DP-DA. The light transmittance and the resolution are measured in a reference area. The sensing region DP-TA has a smaller occupation rate of a light shielding structure in the reference area than the display region DP-DA. The light shielding structure may include a conductive pattern of a circuit layer, an electrode of a light emitting element, a light shielding pattern, etc., which will be described later.

The sensing region DP-TA has a lower resolution in the reference area than the display region DP-DA. The sensing region DP-TA has a smaller number of pixels PX in the reference area (or the same area) than the display region DP-DA.

According to some embodiments, the pixels PX located in the display region DP-DA, and the pixels PX located in the sensing region DP-TA, may have light emitting areas different from each other when areas of the same color pixels are compared. In addition, the display region DP-DA and the sensing region DP-TA may differ from each other in an arrangement of one pixel unit which includes pixels providing colors different from each other. The light emitting areas of the pixels located in the display region DP-DA and the sensing region DP-TA, and the arrangement of pixels included in the pixel unit, are not limited to any one embodiment.

Figure 4:
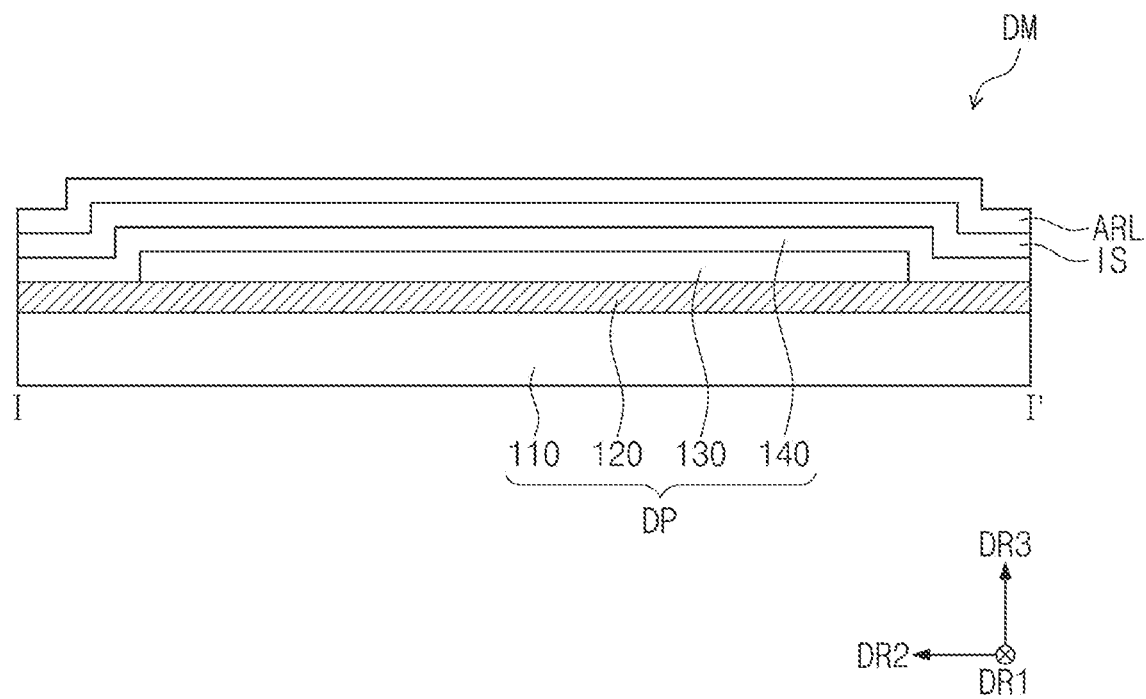
FIG. 4 is a cross-sectional view of a display module according to some embodiments of the inventive concept.

FIG. 4 is a cross-sectional view of a display module according to some embodiments of the inventive concept.

Referring to FIG. 4, a display module DM may include a display panel DP, an input sensor IS, and an anti-reflective layer ARL. The display panel DP may include a base layer 110, a circuit layer 120, a light emitting element layer 130 and an encapsulation layer 140.

The base layer 110 may provide a base surface on which the circuit layer 120 is located. The base layer 110 may be a flexible substrate capable of bending, folding, rolling, etc. The base layer 110 may be a glass substrate, a metal substrate, a polymer substrate, etc. However, embodiments of the inventive concept are not limited thereto, and the base layer 110 may be an inorganic layer, an organic layer or a composite material layer.

The base layer 110 may have a multilayer structure. For example, the base layer 110 may include a first synthetic resin layer, an inorganic monolayer or multilayer, and a second synthetic resin layer located on the inorganic monolayer or multilayer. The first and second synthetic resin layers each may include a polyimide-based resin, and are not particularly limited. In addition, the base layer 110 may be provided with the first synthetic resin layer alone, and embodiments of the inventive concept are not limited to any one embodiment.

The circuit layer 120 may be located on the base layer 110. The circuit layer 120 may include an insulating layer, a semiconductor pattern, a conductive pattern, a signal line, etc.

The light emitting element layer 130 may be located on the circuit layer 120. The light emitting element layer 130 may include a light emitting element. For example, the light emitting element may include an organic light emitting material, an inorganic light emitting material, an organic-inorganic light emitting material, a quantum dot, a quantum load, a micro LED or a nano LED.

The encapsulation layer 140 may be located on the light emitting element layer 130. The encapsulation layer 140 may protect the light emitting element layer 130 from a foreign material such as moisture, oxygen and dust particles. The encapsulation layer 140 may include at least one inorganic layer. The encapsulation layer 140 may include a stacked structure of inorganic layer/organic layer/inorganic layer.

The input sensor IS may be located directly on the display panel DP. The display panel DP and the input sensor IS may be formed through a continuous process. Here, "being located directly" may mean that a third element is not located between the input sensor IS and the display panel DP. That is, a separate adhesive layer may not be located between the input sensor IS and the display panel DP.

The anti-reflective layer ARL may be located directly on the input sensor IS. The anti-reflective layer ARL may reduce the reflectance of external light incident from the outside of the display device DD.

The anti-reflective layer ARL may include color filters. The color filters may have a set or predetermined arrangement. For example, the color filters may be arranged considering light emitting colors of the pixels included in the display panel DP. In addition, the anti-reflective layer ARL may further include a black matrix adjacent to the color filters.

According to some embodiments of the inventive concept, the input sensor IS and the anti-reflective layer ARL may be stacked in a different order. According to some embodiments of the inventive concept, the anti-reflective layer ARL may be replaced with a polarizing film. The polarizing film may be bonded to the input sensor IS through the adhesive layer.

Figure 5:
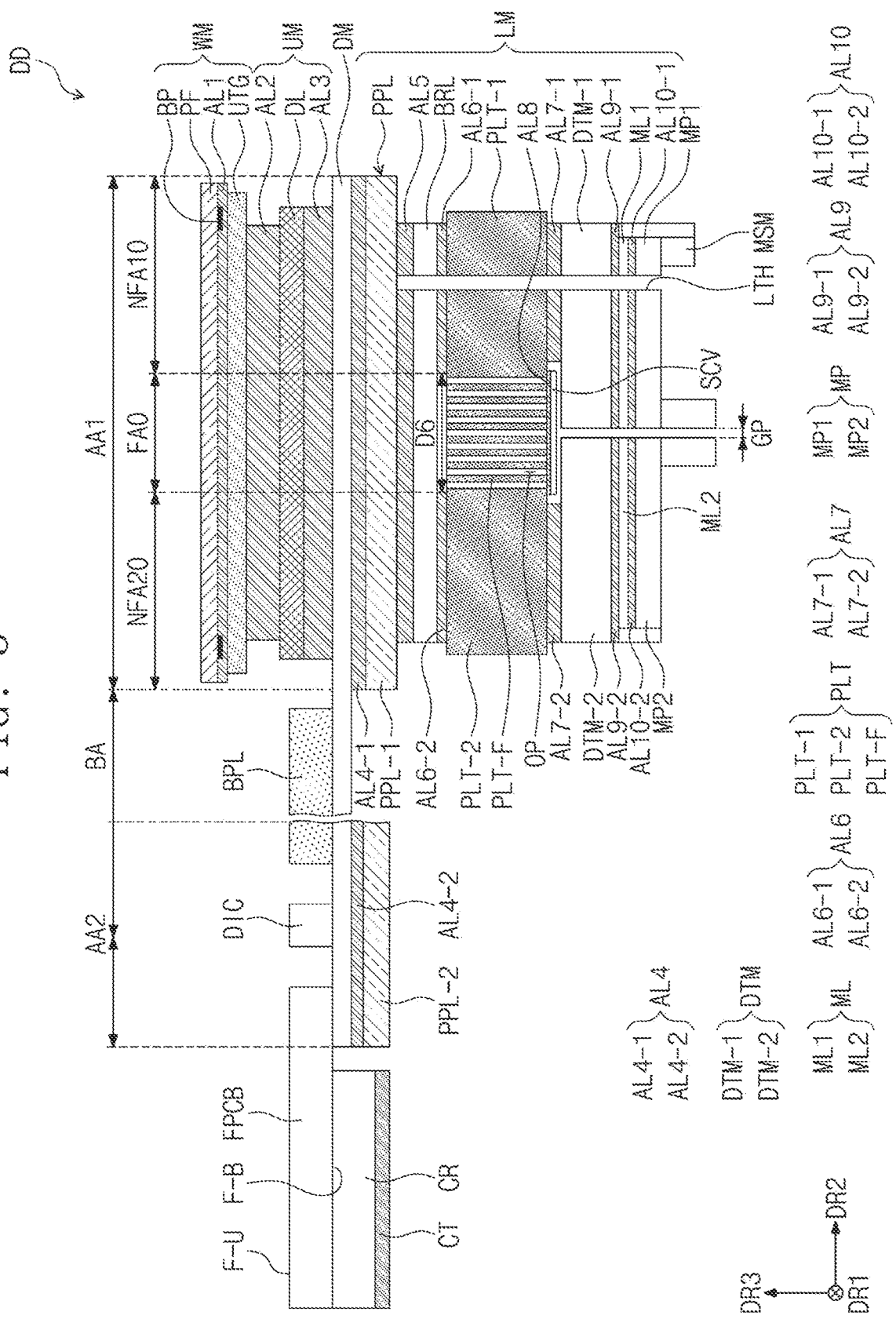
FIG. 5 is a cross-sectional view of a display device according to some embodiments of the inventive concept.
Figure 6:
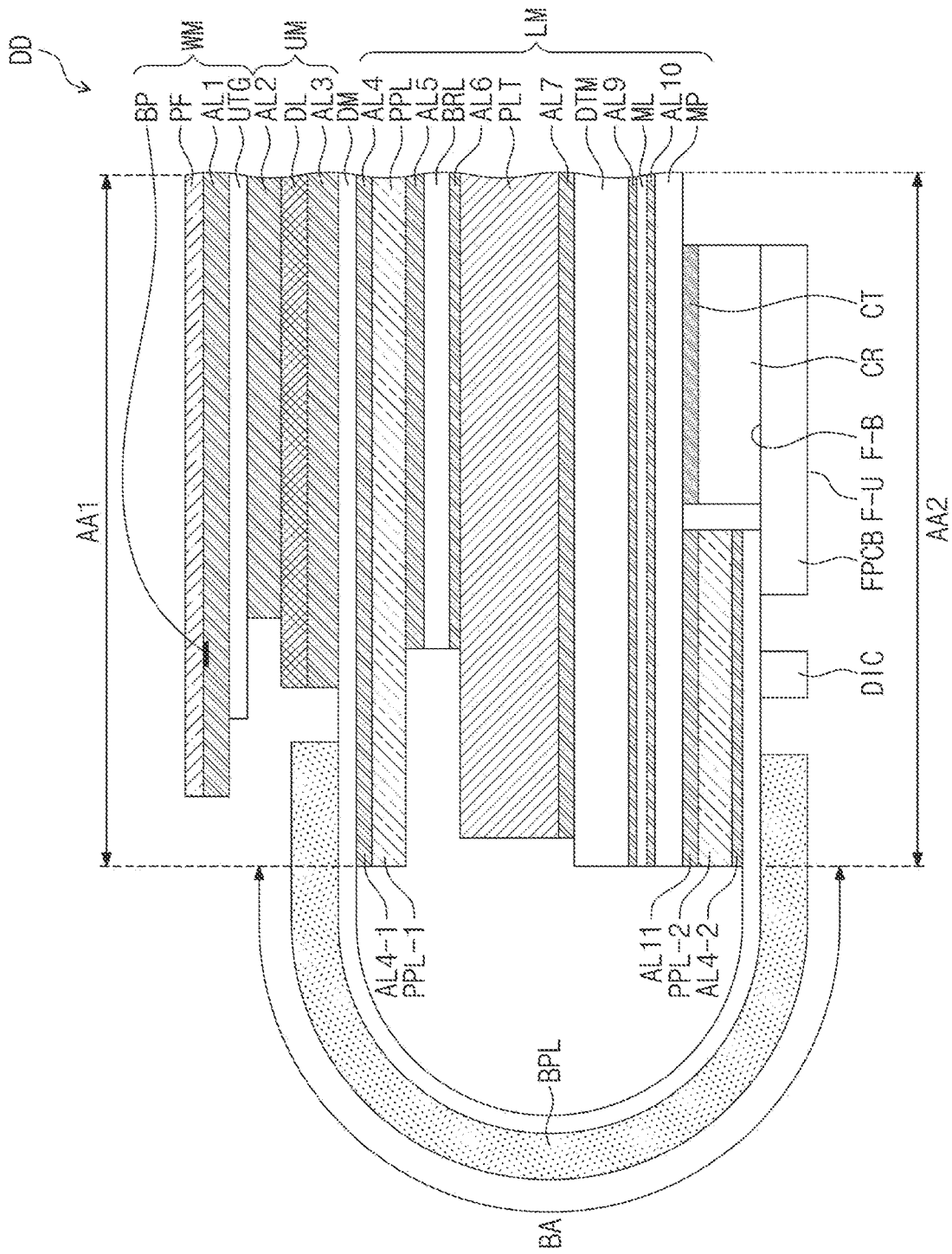
FIG. 6 is a cross-sectional view illustrating a state in which a part of a display device according to some embodiments of the inventive concept is bent.

FIG. 5 is a cross-sectional view of a display device according to some embodiments of the inventive concept. FIG. 6 is a cross-sectional view illustrating a state in which a part of a display device according to some embodiments of the inventive concept is bent.

FIG. 5 illustrates a display device DD in a state or configuration where a bending region BA of a display module DM is not bent. FIG. 6 illustrates the display device DD in a state or configuration where the bending region BA of the display module DM is bent. FIGS. 5 and 6 illustrate regions into which the display module DM is divided, on the basis of the display panel DP in FIG. 3.

Referring to FIGS. 5 and 6, the display device DD includes a window WM, an upper member UM, a display module DM and a lower member LM. The upper member UM collectively refers to components located between the window WM and the display module DM, and the lower member LM collectively refers to components located below the display module DM.

The window WM may include a thin film glass substrate UTG, a window protective layer PF located on the thin film glass substrate UTG, and a bezel pattern BP located on a lower surface of the window protective layer PF. According to some embodiments, the window protective layer PF may include a synthetic resin film. The window WM may include an adhesive layer AL1 (hereinafter a first adhesive layer) for bonding the window protective layer PF and the thin film glass substrate UTG.

The bezel pattern BP overlaps the non-display region NDA illustrated in FIG. 1A. The bezel pattern BP may be located on one surface of the thin film glass substrate UTG or one surface of the window protective layer PF. FIG. 5 illustrates the bezel pattern BP being located on the lower surface of the window protective layer PF, but embodiments according to the present disclosure are not limited thereto.

Embodiments of the inventive concept are not limited thereto, and the bezel pattern BP may be located on an upper surface of the window protective layer PF. The bezel pattern BP may be formed using a colored light-shielding film, for example, through a coating process. The bezel pattern BP may include a base material and a dye or pigment mixed with the base material.

The thin film glass substrate UTG may have a thickness of about 15 μm to about 45 μm. The thin film glass substrate UTG may be a chemically strengthened glass. The thin film glass substrate UTG may minimize or reduce the occurrence of wrinkles even when folding and unfolding operations are repeated.

The window protective layer PF may have a thickness of about 50 μm to about 80 μm. The synthetic resin film of the window protective layer PF may include polyimide, polycarbonate, polyamide, triacetylcellulose, polymethylmethacrylate or polyethylene terephthalate. According to some embodiments, at least one of a hard coating layer, an anti-fingerprint layer, or an anti-reflective layer may be located on the upper surface of the window protective layer PF.

The first adhesive layer AL1 may be a pressure sensitive adhesive film (PSA) or an optically clear adhesive (OCA). Adhesive layers to be described in further detail below may also include the same adhesive as the first adhesive layer AL1.

The first adhesive layer AL1 may be detached from the thin film glass substrate UTG. Because the window protective layer PF has lower strength than the thin film glass substrate UTG, a scratch may occur relatively easily. After the first adhesive layer AL1 and the window protective layer PF are detached, a new window protective layer PF may be attached to the thin film glass substrate UTG.

The upper member UM includes an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb external impact applied to a front surface of the display device DD. The display module DM described with reference to FIG. 4 may include the anti-reflective layer ARL replacing the polarizing film and consequently, the impact strength applied to the front surface of the display device DD may be reduced. The upper film DL may compensate for the impact strength reduced by application of the anti-reflective layer ARL. According to some embodiments of the inventive concept, the upper film DL may be omitted. The upper member UM may include a second adhesive layer AL2 that bonds the upper film DL and the window WM, and a third adhesive layer AL3 that bonds the upper film DL and the display module DM.

The lower member LM may include a panel protective layer PPL, a barrier layer BRL, a support layer PLT, a cover pattern SCV, a digitizer DTM, a metal layer ML, a lower plate MP, a heat release layer HRP and fourth to tenth adhesive layers AL4 to AL10.

The fourth to tenth adhesive layers AL4 to AL10 may each be a pressure sensitive adhesive film (PSA) or an optically clear adhesive (OCA). According to some embodiments of the inventive concept, some of the above-described components may be omitted. For example, an adhesive layer may be omitted which is located between the lower member LM or the heat release layer HRP and an omitted component.

The panel protective layer PPL may be located below the display module DM. The panel protective layer PPL may protect a lower portion of the display module DM. The panel protective layer PPL may include a flexible synthetic resin film. For example, the panel protective layer PPL may include polyethylene terephthalate.

According to some embodiments of the inventive concept, the panel protective layer PPL may not be arranged in the bending region BA. The panel protective layer PPL may include a first panel protective layer PPL-1 for protecting the first region AA1 of the display panel DP (see FIG. 3), and a second panel protective layer PPL-2 for protecting the second region AA2.

The fourth adhesive layer AL4 bonds the panel protective layer PPL and the display panel DP. The fourth adhesive layer AL4 may include a first portion AL4-1 corresponding to the first panel protective layer PPL-1, and a second portion AL4-2 corresponding to the second panel protective layer PPL-2.

The fifth adhesive layer AL5 bonds the panel protective layer PPL and the barrier layer BRL. The barrier layer BRL may be located below the panel protective layer PPL. The barrier layer BRL may increase resistance to a compressive force caused by external press. Thus, the barrier layer BRL may play a role in preventing deformation of the display panel DP.

The barrier layer BRL may include a flexible plastic material such as polyimide or polyethylene terephthalate. In addition, the barrier layer BRL may be a colored film having a low light transmittance. The barrier layer BRL may absorb light incident from the outside. For example, the barrier layer BRL may be a black synthetic resin film. When the display device DD is seen from above the window protective layer PF, components located below the barrier layer BRL may not be visible to a user.

The sixth adhesive layer AL6 bonds the barrier layer BRL and the support layer PLT. The sixth adhesive layer AL6 may include a first portion AL6-1 and a second portion AL6-2 which are spaced apart from each other. The spaced distance D6 between the first portion AL6-1 and the second portion AL6-2 corresponds to the width of a folding region FAO in the second direction DR2, and is greater than a gap GP to be described in more detail later.

According to some embodiments, the first portion AL6-1 and the second portion AL6-2 are defined as different portions of one adhesive layer, but are not limited thereto. When the first portion AL6-1 is defined as one adhesive layer (e.g., a first adhesive layer or a second adhesive layer), the second portion AL6-2 may be defined as another adhesive layer (e.g., a second adhesive layer or a third adhesive layer). This definition may also be applied not only to the sixth adhesive layer AL6 but also to every adhesive layer including two portions, among adhesive layers to be described in more detail later.

The upper plate PLT is located below the barrier layer BRL. The upper plate PLT may support components located above the upper plate PLT, and maintain an unfolding state and a folding state of the display device DD. The upper plate PLT has greater strength than the barrier layer BRL. The upper plate PLT at least includes a first support portion PLT-1 corresponding to a first non-folding region NFA10, and a second support portion PLT-2 corresponding to a second non-folding region NFA20. The first support portion PLT-1 and the second support portion PLT-2 are spaced apart from each other in the second direction DR2.

The upper plate PLT corresponds to the folding region FAO and is located between the first support portion PLT-1 and the second support portion PLT-2. A plurality of opening portions OP may be defined in the folding portion PLT-F so as to penetrate the folding portion PLT-F.

The plurality of opening portions OP may be arranged such that the folding region FAO has a grid shape on a plane. The first support portion PLT-1, the second support portion PLT-2 and the folding portion PLT-F may have an integrated shape.

The folding portion PLT-F may prevent or reduce instances of a foreign material or contaminant being introduced into an opened region of the barrier layer BRL from the first support portion PLT-1 and the second support portion PLT-2 during the folding operation illustrated in FIGS. 1B and 1C.

Due to the plurality of opening portions OP, the flexibility of the folding portion PLT-F is improved. In addition, the sixth adhesive layer AL6 may not be located in the folding portion PLT-F, thereby improving the flexibility of the upper plate PLT. According to some embodiments of the inventive concept, the folding portion PLT-F may be omitted. In this case, the upper plate PLT includes the first support portion PLT-1 and the second support portion PLT-2 which are spaced apart from each other.

The upper plate PLT may be selected from among materials which allow an electromagnetic field, generated by a digitizer to be described in more detail later, to pass therethrough without loss or with relatively minimal or reduced loss. The upper plate PLT may include a non-metal material.

The upper plate PLT may include a fiber-reinforced composite material. The upper plate PLT may include a reinforced fiber located inside a matrix section. The reinforced fiber may be a carbon fiber or a glass fiber. The matrix section may include a polymer resin. The matrix section may include a thermoplastic resin.

For example, the matrix section may include a polyimide-based resin or a polypropylene-based resin. For example, the fiber-reinforced composite material may be a carbon fiber reinforced plastic (CFRP) or a glass fiber reinforced plastic (GFRP).

When a digitizer DTM is omitted in the display device DD according to some embodiments, it may not matter whether the electromagnetic field generated by the digitizer DTM is lost or not. Thus, the upper plate PLT may include a metal material having greater strength than the fiber-reinforced composite material. For example, the upper plate PLT may include stainless steel, and is not limited to any one embodiment.

The cover pattern SCV and the digitizer DTM are located below the upper plate PLT. The cover pattern SCV is arranged to overlap the folding region FAO. The digitizer DTM may include a first digitizer DTM-1 and a second digitizer DTM-2 which overlap the first support portion PLT-1 and the second support portion PLT-2, respectively. A portion of each of the first digitizer DTM-1 and the second digitizer DTM-2 may be located below the cover pattern SCV.

The seventh adhesive layer AL7 bonds the upper plate PLT and the digitizer DTM, and the eighth adhesive layer AL8 bonds the cover pattern SCV and the upper plate PLT. The seventh adhesive layer AL7 may include a first portion AL7-1 that bonds the first support portion PLT-1 and the first digitizer DTM-1, and a second portion AL7-2 that bonds the second support portion PLT-2 and the second digitizer DTM-2.

The cover pattern SCV may be located between the first portion AL7-1 and the second portion AL7-2 in the second direction DR2. The cover pattern SCV may be spaced apart from the digitizer DTM in the third direction DR3 so as to prevent or reduce interference with the digitizer DTM in an unfolded state. Thus, the sum of the thicknesses of the cover pattern SCV and the eighth adhesive layer AL8 may be smaller than the thickness of the seventh adhesive layer AL7.

The cover pattern SCV may cover the opening portions OP in the folding portion PLT-F. The cover pattern SCV may have lower elastic modulus than the upper plate PLT. For example, the cover pattern SCV may include thermoplastic polyurethane, rubber or silicone, but embodiments of the inventive concept are not limited thereto.

The digitizer DTM may be an EMR sensing panel. The digitizer DTM includes multiple loop coils which generate a magnetic field of a preset resonant frequency with an electric pen. The magnetic field created by the loop coils is applied to an LC resonance circuit including an inductor (coil) and a capacitor of the electric pen.

The coil generates a current by the received magnetic field, and delivers the generated current to the capacitor. Accordingly, the capacitor charges the current which is input from the coil, and discharges the charged current to the coil. As a result, the magnetic field of the resonant frequency may be emitted from the coil. The magnetic field emitted from the electric pen may be re-absorbed by the loop coils of the digitizer. Accordingly, it may be determined which portion of the sensing panel the electric pen is close to.

The first digitizer DTM-1 and the second digitizer DTM-2 are arranged to be spaced apart from each other with a gap (e.g., a set or predetermined gap) GP therebetween. The gap GP may overlap the folding region FAO. The first digitizer DTM-1 and the second digitizer DTM-2 spaced apart from each other with the folding region FAO therebetween may be connected to a main circuit board through a flexible circuit board. The main circuit board may be an electronic component constituting an electronic module EM.

The metal layer ML is located below the digitizer DTM. The metal layer ML may include a first metal layer ML1 and a second metal layer ML2 which overlap the first support portion PLT-1 and the second support portion PLT-2, respectively. The metal layer ML may release, to the outside, heat generated when the digitizer DTM is driven.

The metal layer ML delivers or transfers (e.g., conducts) the heat to be generated in the digitizer DTM downwards. The metal layer ML may have higher electrical conductivity and thermal conductivity than a lower plate to be described in more detail later. The metal layer ML may include copper or aluminum. The metal layer ML having relatively higher electrical conductivity than the lower plate may block an electromagnetic wave generated by the electronic module EM (see FIG. 2A) located therebelow, from affecting the digitizer DTM as noise.

The ninth adhesive layer AL9 bonds the digitizer DTM and the metal layer ML. The ninth adhesive layer AL9 may include a first portion AL9-1 and a second portion AL9-2 which correspond to the first metal layer ML1 and the second metal layer ML2, respectively.

The lower plate MP is located below the metal layer ML. The lower plate MP may include a first lower plate MP1 and a second lower plate MP2 which overlap the first metal layer ML1 and the second metal layer ML2, respectively. The lower plate MP may absorb external impact applied to the lower portion thereof.

The lower plate MP may have a relatively larger thickness than the metal layer ML. The lower plate MP may include a fiber-reinforced composite material. The lower plate MP may include a reinforced fiber located inside the matrix section. The reinforced fiber may be a carbon fiber or a glass fiber. The matrix section may include a polymer resin. The matrix section may include a thermoplastic resin.

For example, the matrix section may include a polyamide-based resin or a polypropylene-based resin. For example, the fiber-reinforced composite material may be a carbon fiber reinforced plastic (CFRP) or a glass fiber reinforced plastic (GFRP).

The tenth adhesive layer AL10 bonds the metal layer ML and the lower plate MP. The tenth adhesive layer AL10 may include a first portion AL10-1 and a second portion AL10-2 which correspond to the first lower plate MP1 and the second lower plate MP2, respectively.

According to some embodiments, a heat release layer may be further included which is located below the lower plate MP. The heat release layer may include a first heat release layer and a second heat release layer which overlap the first lower plate MP1 and the second lower plate MP2, respectively. The heat release layer releases heat generated in electronic components located therebelow. The heat release layer may have a structure in which an adhesive layer and a graphite layer are alternatively stacked.

A magnetic field shielding sheet MSM is located below the lower plate MP. The magnetic field shielding sheet MSM shield a magnetic field generated by a magnetic body located therebelow. The magnetic field shielding sheet MSM may prevent the magnetic field generated by the magnetic body from interfering with the digitizer DTM.

The magnetic field shielding sheet MSM includes a plurality of portions. At least some of the plurality of portions may have different thicknesses. The plurality of portions may be formed to conform to the contours of the stepped portions of a bracket located below the display device DD. The magnetic field shielding sheet MSM may have a structure in which a magnetic field shielding layer and an adhesive layer are alternatively stacked. One portion of the magnetic field shielding sheet MSM may be attached directly to the lower plate MP.

A through-hole LTH may be formed in some members of the lower member LM. The through-hole LTH is arranged to overlap the sensing region DP-TA in FIG. 2A. As illustrated in FIG. 5, the through-hole LTH may penetrate from the fifth adhesive layer AL5 to the lower plate MP. The through-hole LTH is formed by removing a shielding structure from an optical signal path, and the through-hole LTH may improve the optical signal reception efficiency of the electro-optic module ELM.

The flexible circuit board FCB may be connected to the second region AA2 of the display module DM. As illustrated in FIG. 6, when the bending region BA of the display module DM is bent, the flexible circuit board FCB may be arranged adjacent to the lower plate MP together with the second region AA2. Here, the second region AA2 may face the first region AA1 in a state where the bending region BA of the display device DD is bent.

A bending protective layer BPL is located at least in the bending region BA. The bending protective layer BPL may cover the bending region BA, and overlap a portion of each of the first region AA1 and the second region AA2. The bending protective layer BPL may be bent together with the bending region BA. The bending protective layer BPL protects the bending region BA from external impact, and controls a neutral plane of the bending region BA. The bending protective layer BPL controls stress of the bending region BA such that signal lines located in the bending region BA become close to the neutral plane.

When the bending region BA is bent, the second panel protective layer PPL-2 may be attached to the lower plate MP through an eleventh adhesive layer AL11. Accordingly, the bending region BA of the display module DM may be stably coupled to the lower plate MP in the bent state. The eleventh adhesive layer AL11 may be omitted.

The flexible circuit board FCB may include a first surface F-B and a second surface F-U. In a state where the bending region BA of the display device DD is bent, the first surface F-B may be defined as a surface facing the lower plate MP. A resin layer CR may be located on the first surface F-B of the flexible circuit board FCB.

The resin layer CR according to some embodiments may include a resin composition. The resin composition included in the resin layer CR may be an electrically conductive thermoplastic resin composition in which at least one conductive additive of carbon black, carbon fiber, metal powder, metal-coated inorganic powder or metal fiber is mixed with a thermoplastic resin. However, embodiments of the inventive concept are not limited thereto, and as long as the resin composition included in the resin layer CR includes a conductive material, the resin layer CR is not limited to any one embodiment.

The resin layer CR may cover stepped regions defined in the first surface F-B of the flexible circuit board FCB to be described in more detail later, and provide a flat surface for components located on the resin layer CR.

The resin layer CR may be bonded to the lower plate MP through a conductive adhesive layer CT (hereinafter 'adhesive layer'). The adhesive layer CT may be either of a pressure sensitive adhesive film (PSA) or an optically clear adhesive (OCA). As long as the adhesive layer includes a conductive material, the adhesive layer CT is not limited to any one embodiment. The adhesive layer CT may be integrated with the eleventh adhesive layer AL11, and is not limited to any one embodiment.

Figure 7:
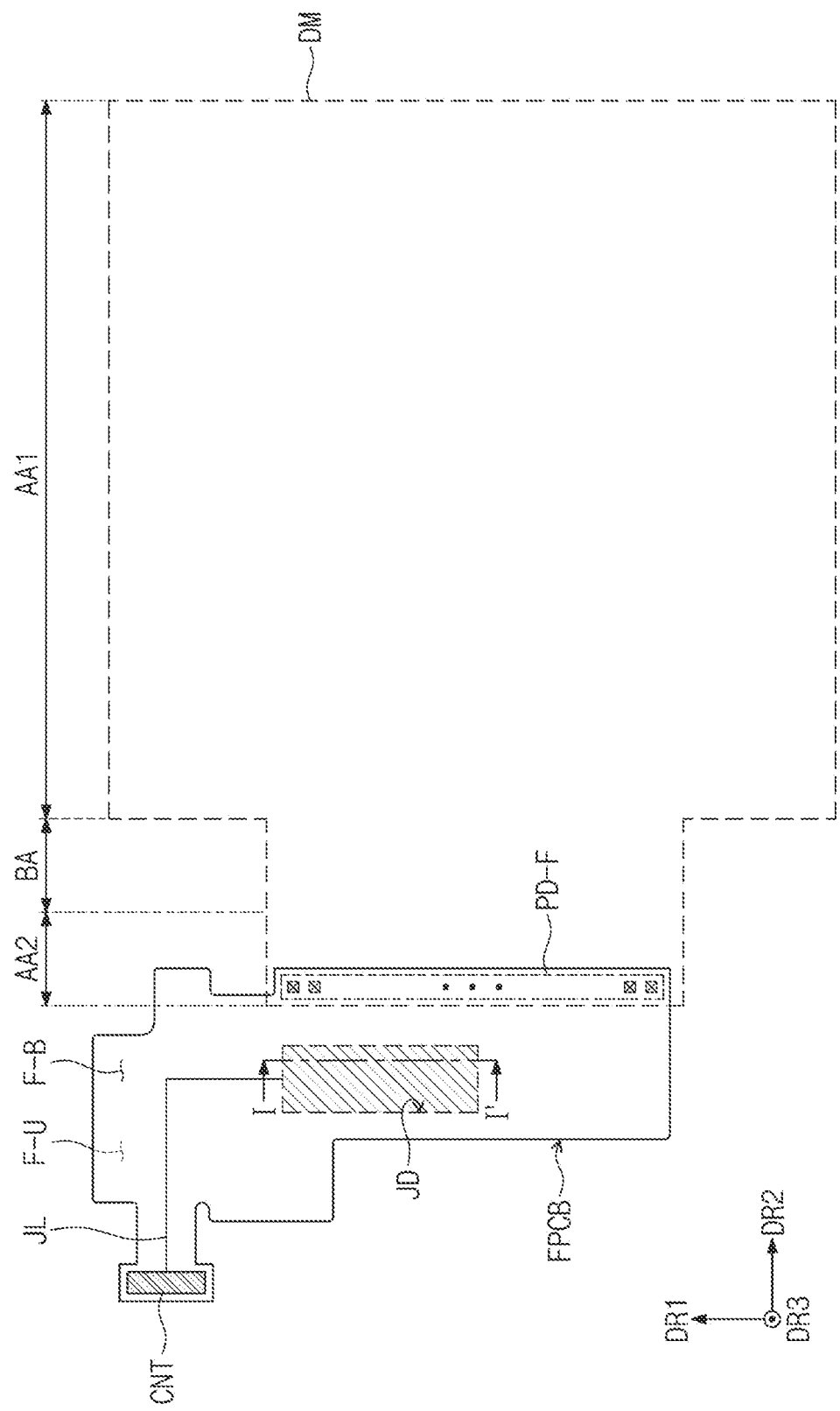
FIG. 7 is a rear view illustrating a connection relationship between a display module and a flexible circuit board according to some embodiments of the inventive concept.
Figure 8A:
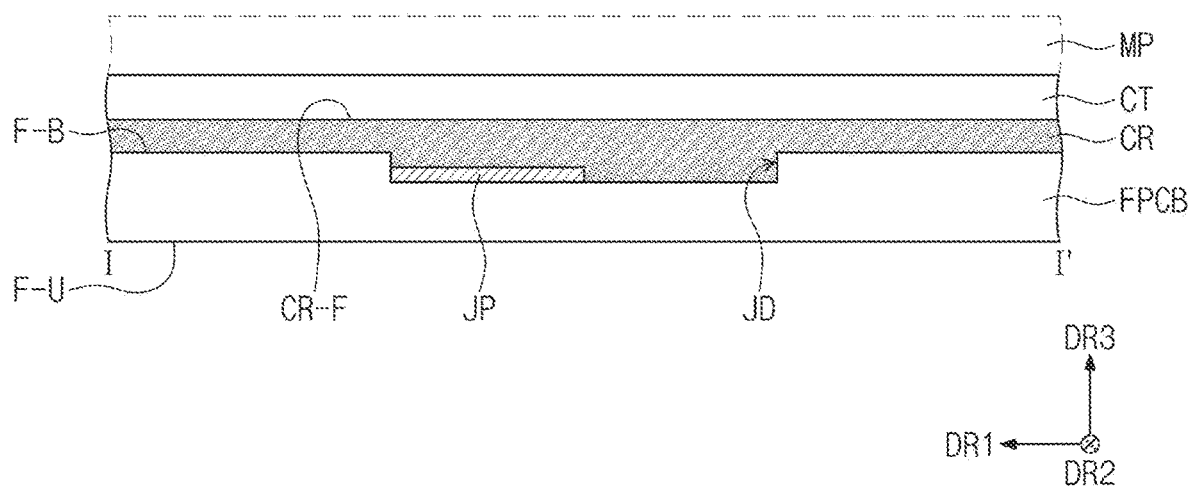
FIG. 8A is a cross-sectional view taken along the line I-I' in FIG. 7.
Figure 8B:
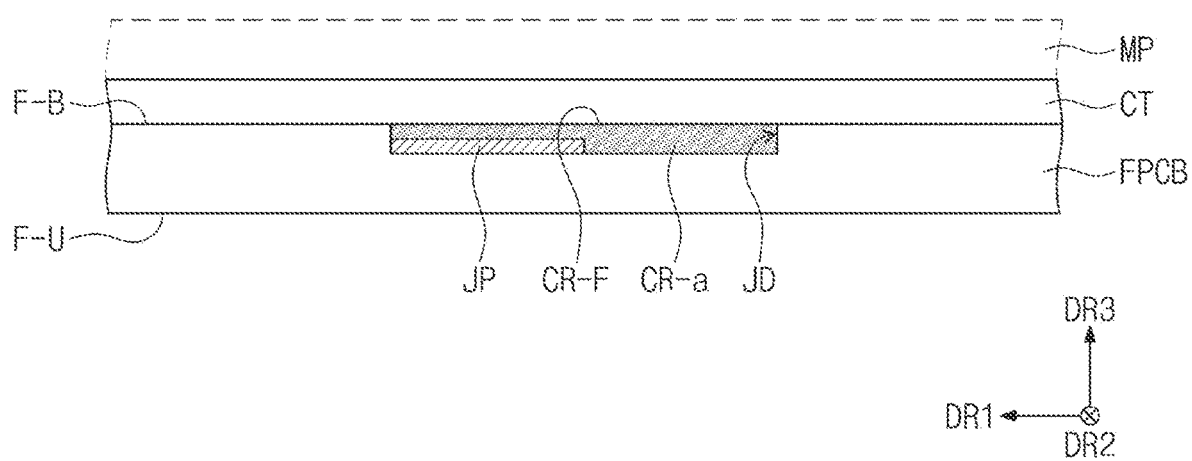
FIG. 8B is a cross-sectional view illustrating a flexible circuit board, a covered layer and an adhesive layer according to some embodiments of the inventive concept.

FIG. 7 is a rear view illustrating a connection relationship between a display module and a flexible circuit board according to some embodiments of the inventive concept. FIG. 8A is a cross-sectional view taken along the line I-I' in FIG. 7. FIG. 8B is a cross-sectional illustrating a flexible circuit board, a covered layer and an adhesive layer according to some embodiments of the inventive concept.

A flexible circuit board to be described in more detail below may include a plurality of insulating layers, and a plurality of conductive layers located between the insulating layers. The number of the insulating layers and the number of the conductive layers may vary depending on the resolution of the required pixels PX (see FIG. 3). The flexible circuit board including a ground pattern JP exposed by removal of any one insulating layer may have characteristics corresponding to those of the flexible circuit board of the inventive concept without limiting the number of the insulating layers and the number of the conductive layers.

Thus, in various embodiments of a flexible circuit board to be described in more detail below, the insulating layers and the conductive layers are each illustrated as a single layer, and only a ground pattern which is a part of the insulating layers, and a ground signal line connected to the ground pattern, are illustrated.

In addition, according to some embodiments with reference to a cross-sectional view illustrating a flexible circuit board, a covered layer and an adhesive layer which will be described in more detail below, a lower plate MP is illustrated with a dotted line.

Referring to FIGS. 7 and 8A, a flexible circuit board FCB according to some embodiments may include a ground pattern JP, a connector CNT, and a ground signal line JL for connecting the ground pattern JP and the connector CNT.

The connector CNT may be connected to pads located on a first surface F-B of the flexible circuit board FCB. The connector CNT may be a connection terminal to be connected to a main circuit board. Thus, the flexible circuit board FCB may be connected to the main circuit board through the connector CNT.

The ground pattern JP may be branched from any one of a plurality of conductive layers included in the flexible circuit board FCB. The ground pattern JP may be exposed, by an opening portion JD, from at least one insulating layer included in the flexible circuit board FCB.

One end of the ground signal line JL may be connected to the ground pattern JP, and the other end of the ground signal line JL may be connected to a ground pad to be connected to the connector. A pad connected to the ground pad in the connector CNT may be connected to a ground terminal located inside the housing HM of the electronic device ED (see FIG. 2A).

The opening portion JD formed by removing at least one insulating layer may be defined in the flexible circuit board FCB. The opening portion JD may be formed by removing a part of the flexible circuit board FCB in a direction from the first surface F-B toward a second surface F-U, i.e., in the third direction DR3.

As the opening portion JD is formed, a 'stepped region' may be created between unremoved insulating layers and insulating layers adjacent thereto. The shapes of components located in the stepped region may be deformed by a stepped portion during compression of the display device DD, causing a defect in which the components are visible in the display region DP-DA of the display panel DP (see FIG. 2A).

A resin layer CR may be located on the first surface F-B of the flexible circuit board FCB. The resin layer CR may be located in the opening portion JD and cover the opening portion JD. The resin layer CR may be in contact with the ground pattern JP exposed from the insulating layers by the opening portion JD. As described above, the resin layer CR may include a conductive resin composition.

The resin layer CR according to some embodiments of the inventive concept may remove the stepped region formed during the process for exposing the ground pattern JP, and provide a flat surface CR-F for a component located on the resin layer CR. Thus, the lower plate MP to be bonded to the adhesive layer CT may be located on the flexible circuit board FCB without any effect of the stepped region due to the opening portion JD, and a phenomenon in which components located on the flexible circuit board FCB are pressed by the stepped portion may be prevented or reduced.

In addition, according to some embodiments of the inventive concept, because a path is formed along which static electricity introduced into the flexible circuit board FCB from the outside, for example, by user's touch, etc., is discharged to the ground pattern JP through the adhesive layer CT and resin layer CR including a conductive material, a short-circuit defect caused by the static electricity in the flexible circuit board FCB may be prevented. Accordingly, the electronic device ED with the enhanced reliability may be provided.

Referring to FIG. 8B, a resin layer CR-a according to some embodiments may be located only in an opening portion JD. A flat surface CR-F of the resin layer CR-a according to some embodiments may define the same plane as the first surface F-B of the flexible circuit board FCB. Accordingly, a portion of an adhesive layer CT may be in contact with the flat surface CR-F of the resin layer CR-a, and the remaining portion of the adhesive layer CT may be in contact with the first surface F-B of the flexible circuit board FCB.

Figure 9A:
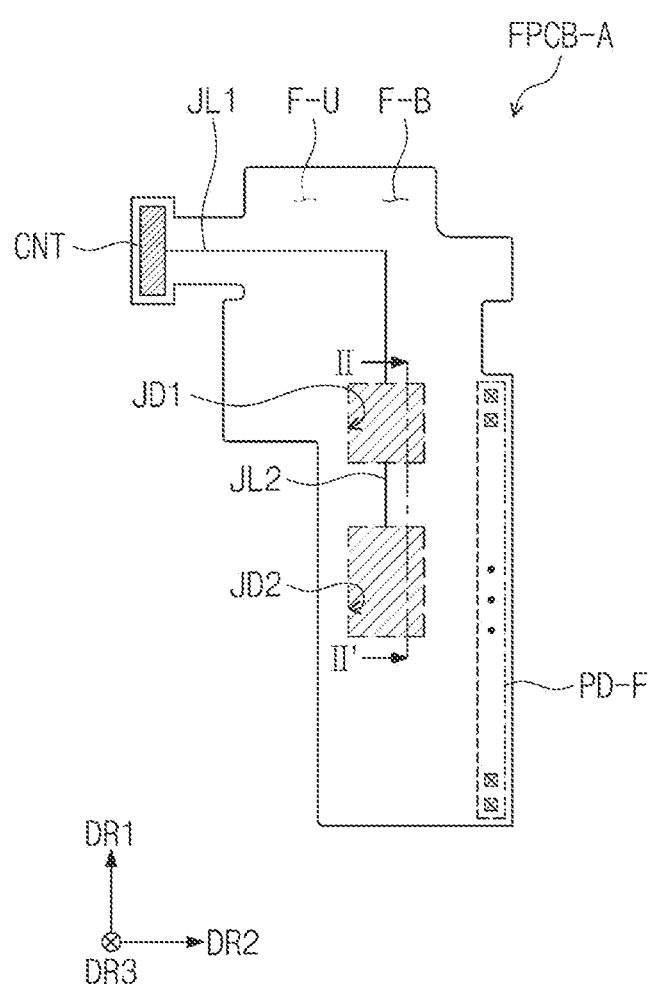
FIG. 9A is a plan view of a flexible circuit board according to some embodiments of the inventive concept.
Figure 9B:
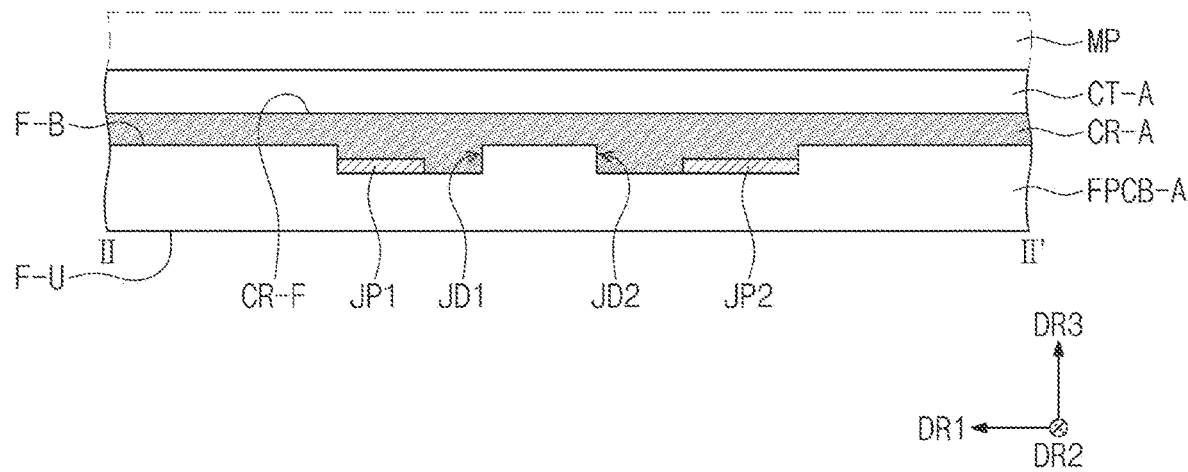
FIG. 9B is a cross-sectional view taken along the line II-II' in FIG. 9A.
Figure 9C:
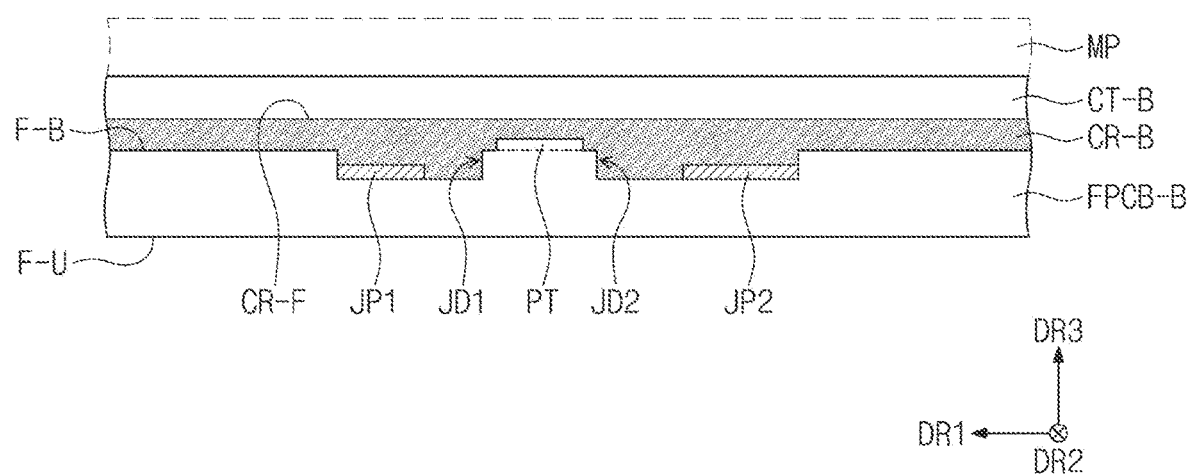
FIG. 9C is a cross-sectional view illustrating a flexible circuit board, a covered layer and an adhesive layer according to some embodiments of the inventive concept.
Figure 9D:
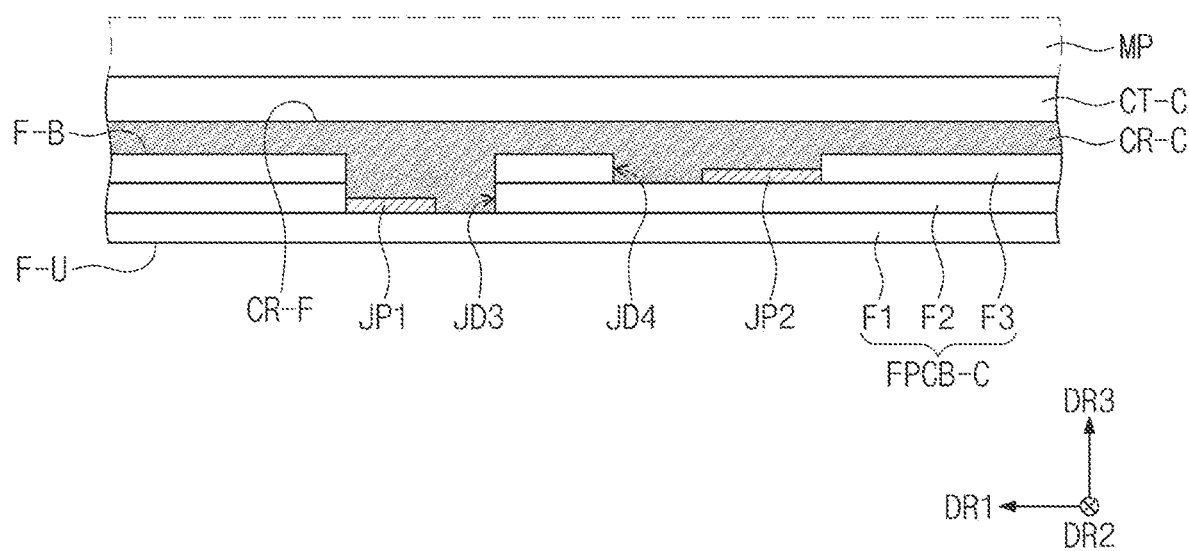
FIG. 9D is a cross-sectional view illustrating a flexible circuit board, a covered layer and an adhesive layer according to some embodiments of the inventive concept.

FIG. 9A is a plan view of a flexible circuit board according to some embodiments of the inventive concept. FIG. 9B is a cross-sectional view taken along the line II-II' in FIG. 9A. FIG. 9C is a cross-sectional view illustrating a flexible circuit board, a covered layer and an adhesive layer according to some embodiments of the inventive concept. FIG. 9D is a cross-sectional view illustrating a flexible circuit board, a covered layer and an adhesive layer according to some embodiments of the inventive concept. The same or similar reference numbers or symbols refer to the same/similar elements as/to those described with reference to FIGS. 5 to 8B, and some duplicate description may be omitted.

Referring to FIGS. 9A and 9B, a flexible circuit board FCB-A according to some embodiments may include ground patterns JP1 and JP2, a connector CNT, and ground signal lines JL1 and JL2.

A first opening portion JD1 and a second opening portion JD2 formed by removing at least one insulating layer may be defined in the flexible circuit board FCB-A. The first opening portion JD1 and the second opening portion JD2 may be formed by removing a part of the flexible circuit board FCB-A in a direction from a first surface F-B toward a second surface F-U, i.e., in the third direction DR3. The first opening portion JD1 and the second opening portion JD2 may be spaced apart from each other.

A first ground pattern JP1 may be exposed, by the first opening portion JD1, from the insulating layers of the flexible circuit board FCB-A. A second ground pattern JP2 may be exposed, by the second opening portion JD2, from the insulating layers of the flexible circuit board FCB-A. The first ground pattern JP1 and the second ground pattern JP2 may be branched from the same insulating layer among the insulating layers included in the flexible circuit board FCB-A, or may be branched from the insulating layers located on layers different from each other.

The first ground signal line JL1 may connect the first ground pattern JP1 and the connector CNT, and the second ground signal line JL2 may connect the second ground pattern JP2 and the first ground pattern JP1. FIG. 9A illustrates two opening portions JD1 and JD2, and ground patterns JP1 and JP2 exposed thereby for the purpose of illustration. However, embodiments of the inventive concept are not limited thereto, and the number of opening portions and the number of ground patterns exposed thereby may each be three or more.

A resin layer CR-A may be located on the first surface F-B of the flexible circuit board FCB-A. The resin layer CR-A may be located in the first opening portion JD1 and the second opening portion JD2 to cover the first opening portion JD1 and the second opening portion JD2. The resin layer CR-A may be in contact with the ground patterns JP1 and JP2.

The resin layer CR-A may cover the opening portions JD1 and JD2 provide a flat surface CR-F for a lower plate MP to be located on the resin layer CR-A. An adhesive layer CT-A may be located between the flat surface CR-F and the lower plate MP to bond the resin layer CR-A and the lower plate MP.

Referring to FIG. 9C, a flexible circuit board FCB-B may further include a protrusion portion PT located between opening portions JD1 and JD2. As conductive layers included in the flexible circuit board FCB-B are stacked overlapping, the protrusion portion PT may be formed protruding from a first surface F-B of the flexible circuit board FCB-B in the third direction DR3.

A resin layer CR-B may be located on the first surface F-B of the flexible circuit board FCB-B, and cover the opening portions JD1 and JD2 and the protrusion portion PT.

The resin layer CR-B may provide a flat surface CR-F for a lower plate MP to be located on the resin layer CR-B. An adhesive layer CT-B may be located between the flat surface CR-F and the lower plate MP to bond the resin layer CR-B and the lower plate MP.

Referring to FIG. 9D, a flexible circuit board FCB-C may include first to third insulating layers F1, F2 and F3. A third opening portion JD3 and a fourth opening portion JD4 formed by removing at least part of the first to third insulating layers F1, F2 and F3 may be defined in the flexible circuit board FCB-C.

The third opening portion JD3 may be defined by removing the second insulating layer F2 and the third insulating layer F3 from the first surface F-B, and the fourth opening portion JD4 may be defined by removing the third insulating layer F3 from the first surface F-B.

A first ground pattern JP1 may be located on the first insulating layer F1, and exposed, by the third opening portion JD3, from the second insulating layer F2 and the third insulating layer F3. A second ground pattern JP2 may be located on the second insulating layer F2, and exposed, by the fourth opening portion JD4, from the third insulating layer F3.

A resin layer CR-C may be located on the first surface F-B of the flexible circuit board FCB-C, and cover the third opening portion JD3 and the fourth opening portion JD4. The resin layer CR-C may be in contact with the first ground pattern JP1 and the second ground pattern JP2 which are located on layers different from each other.

The resin layer CR-C may provide a flat surface CR-F for a lower plate MP to be located on the resin layer CR-C. An adhesive layer CT-C may be located between the flat surface CR-F and the lower plate MP to bond the resin layer CR-C and the lower plate MP.

Figure 10A:
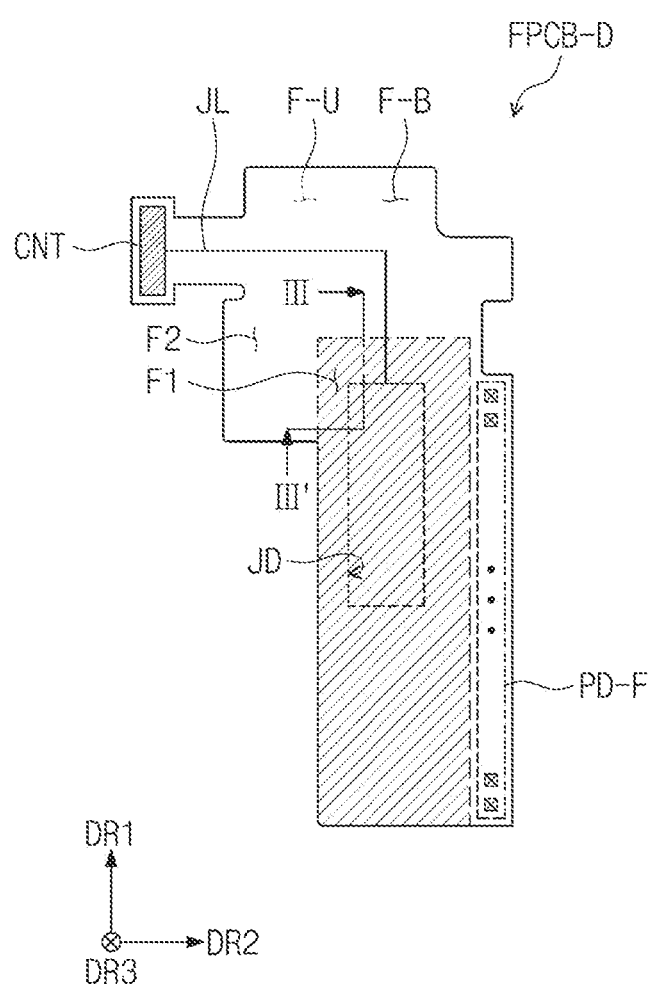
FIG. 10A is a plan view of a flexible circuit board according to some embodiments of the inventive concept.
Figure 10B:
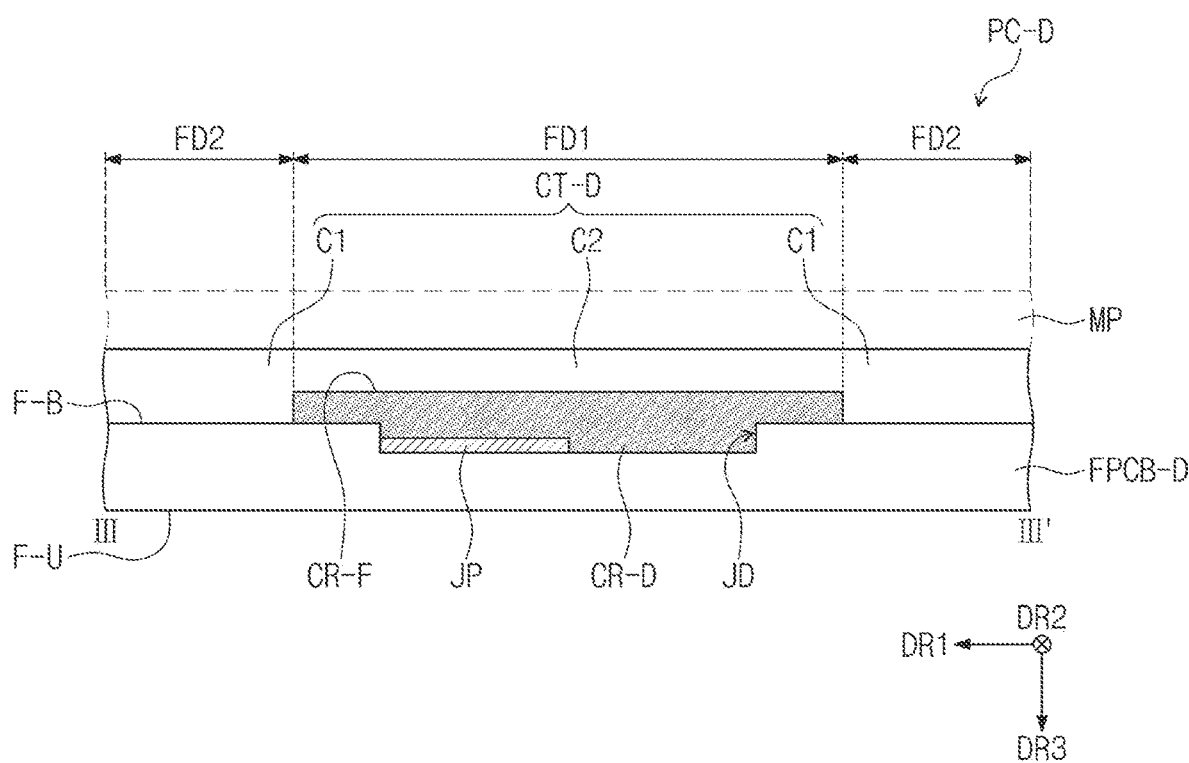
FIG. 10B is a cross-sectional view taken along the line III-III' in FIG. 10A.

FIG. 10A is a plan view of a flexible circuit board according to some embodiments of the inventive concept. FIG. 10B is a cross-sectional view taken along the line III-III' in FIG. 10A. Same/similar reference numbers or symbols refer to the same/similar elements as/to those explained in FIGS. 5 to 8B, and duplicate description is omitted.

Referring to FIGS. 10A and 10B, a flexible circuit board FCB-D according to some embodiments of the inventive concept may include a ground pattern JP, a connector CNT and a ground signal line JL.

An opening portion JD formed by removing at least one insulating layer may be defined in the flexible circuit board FCB-D. The opening portion JD may be formed by removing a part of the flexible circuit board FCB-D in a direction from a first surface F-B toward a second surface F-U, i.e., in the third direction DR3.

The flexible circuit board FCB-D according to some embodiments may include a covered region FD1 in which a resin layer CR-D is located, and an uncovered region FD2 exposed by the resin layer CR-D. The opening portion JD may be defined in the covered region FD1, and the opening portion JD may be separated from the uncovered region FD2.

The resin layer CR-D may be located only in the covered region FD1. Thus, the uncovered region FD2 may be exposed from the resin layer CR-D. The resin layer CR-D may thus provide a flat surface CR-F for a lower plate MP in the covered region FD1.

According to some embodiments, an adhesive layer CT-D may include a first portion C1 and a second portion C2. The first portion C1 may overlap the uncovered region FD2, and the second portion C2 may overlap the covered region FD1. The second portion C2 may be in contact with the flat surface CR-F of the resin layer CR-D. The first portion C1 may be in contact with the first surface F-B of the flexible circuit board FCB-D.

In the adhesive layer CT-D, the first portion C1 and the second portion C2 which are in contact with the lower plate MP provide the same plane. According to some embodiments, even when the resin layer CR-D is located only in one region of the flexible circuit board FCB-D, the adhesive layer CT-D may provide a flat surface on which the lower plate MP may be located.

According to some embodiments of the inventive concept, a covered layer for providing a relatively flat surface may be provided to prevent or reduce a phenomenon in which components located on a flexible circuit board are pressed (or compressed) by a stepped portion.

In addition, because a path is formed along which static electricity introduced into the flexible circuit board from the outside, for example, by a user's touch, etc., is discharged into a ground pattern through an adhesive layer and resin layer including a conductive material, a short-circuit defect caused by the static electricity in the flexible circuit board may be prevented or reduced.

Although the embodiments of the present invention have been described, it is understood that the present invention should not be limited to these embodiments but various changes and modifications can be made by one ordinary skilled in the art within the spirit and scope of the present invention as defined in the following claims and their equivalents.

What is claimed is:

1. An electronic device comprising:
   a display panel including a first region having a pixel therein, a bending region configured to be bent with respect to a virtual axis, and a second region with the bending region between the first region and the second region, wherein the first region and the second region are configured to face each other in a bent configuration;
   a lower plate below the display panel;
   a flexible circuit board connected to the second region, and including insulating layers with an opening portion in at least part thereof, a ground signal line, and a ground pattern exposed from the insulating layers by the opening portion and connected to the ground signal line;
   a resin layer on a first surface of the flexible circuit board, and covering the opening portion, the resin layer having a flat surface; and
   an adhesive layer bonding the flat surface of the resin layer to the lower plate.

2. The electronic device of claim 1, wherein the resin layer and the adhesive layer comprise a conductive material.

3. The electronic device of claim 1, wherein
the resin layer is only in the opening portion, and
the first surface of the flexible circuit board defines a same plane as the flat surface of the resin layer.

4. The electronic device of claim 1, wherein
the opening portion comprises a first opening portion and a second opening portion spaced apart from each other, and
the ground pattern comprises a first pattern exposed from the insulating layers by the first opening portion, and a second pattern exposed from the insulating layers by the second opening portion and connected to the first pattern by the ground signal line,
the first pattern and the second pattern being in contact with the resin layer.

5. The electronic device of claim 4, wherein the flexible circuit board further comprises a protrusion portion between the first opening portion and the second opening portion, and protruding from the first surface toward the resin layer,
the protrusion portion being covered by the resin layer.

6. The electronic device of claim 4, wherein
the insulating layers comprise first to third insulating layers,
the first opening portion is defined by penetrating the second insulating layer and the third insulating layer,
a first ground pattern is on the first insulating layer and exposed from the second insulating layer and the third insulating layer by the first opening portion,
the second opening portion is defined by penetrating the third insulating layer, and
a second ground pattern is on the second insulating layer and exposed from the third insulating layer by the second opening portion.

7. The electronic device of claim 1, wherein
the flexible circuit board comprises a covered region including the opening portion, and an uncovered region separated from the opening portion, and
the resin layer is only in the covered region and separated from the uncovered region.

8. The electronic device of claim 7, wherein the adhesive layer comprises a first portion overlapping the uncovered region, and a second portion overlapping the covered region,
the second portion being in contact with the flat surface, and
the first portion being in contact with the first surface of the flexible circuit board.

9. The electronic device of claim 1, wherein
the first region comprises a first non-folding region, a folding region and a second non-folding region which are arranged in a direction crossing a direction in which the virtual axis extends, and
the electronic device further comprises an upper plate between the display panel and the lower plate,
the upper plate including opening portions overlapping the folding region.

10. The electronic device of claim 9, further comprising a digitizer between the upper plate and the lower plate.

11. The electronic device of claim 10, wherein the digitizer comprises a first digitizer overlapping the first non-folding region, and a second digitizer overlapping the second non-folding region, the first digitizer and the second digitizer being separated by a predetermined gap in the folding region.

12. The electronic device of claim 11, further comprising a first metal layer between the digitizer and the lower plate and overlapping the first digitizer, and a second metal layer overlapping the second digitizer.

13. The electronic device of claim 1, wherein the lower plate comprises any one of a stainless steel or a fiber-reinforced composite material.

14. An electronic device comprising:
a display panel including a first region having a pixel therein, a bending region configured to be bent with respect to a virtual axis, and a second region with the bending region between the first region and the second region, wherein the first region and the second region are configured to face each other in a bent configuration;
a lower plate below the display panel;
a flexible circuit board connected to the second region, including a first surface facing the lower plate and a second surface opposite to the first surface, and including a ground pattern in which a stepped region is defined by removal of a portion of the first surface and which is exposed from the stepped region, and a ground signal line connected to the ground pattern
a resin layer on the first surface of the flexible circuit board and covering the stepped region, the resin layer including a conductive material; and
an adhesive layer between the resin layer and the lower plate and including a conductive material.

15. The electronic device of claim 14, wherein an adhesive-layer-contacting-surface of the resin layer is a flat surface.

16. The electronic device of claim 14, wherein
the resin layer is only in the stepped region, and
the first surface of the flexible circuit board defines a same plane as the adhesive-layer-contacting surface of the resin layer.

17. The electronic device of claim 14, wherein
the stepped region is provided in plurality, and the plurality of stepped regions are spaced apart from each other, and
the ground pattern comprises a plurality of ground patterns which are connected to each other through the ground signal line, and each of which is exposed in a corresponding stepped region of the stepped regions,
the ground patterns being in contact with the resin layer.

18. The electronic device of claim 14, further comprising a protrusion portion between the stepped regions and protruding from the first surface of the flexible circuit board toward the resin layer,
wherein the protrusion portion is covered by the resin layer.

19. The electronic device of claim 14, further comprising:
an upper plate between the display panel and the lower plate; and
a digitizer between the upper plate and the lower plate.

20. The electronic device of claim 14, wherein the lower plate comprises any one of a stainless steel or a fiber-reinforced composite material.

* * * * *